(12) United States Patent
Kuo et al.

(10) Patent No.: US 11,861,090 B2
(45) Date of Patent: Jan. 2, 2024

(54) TOUCH DISPLAY PANEL AND TOUCH DISPLAY APPARATUS

(71) Applicant: Huawei Technologies Co., Ltd., Shenzhen (CN)

(72) Inventors: Tawei Kuo, Shenzhen (CN); Junyong Zhang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 17/799,572

(22) PCT Filed: Feb. 2, 2021

(86) PCT No.: PCT/CN2021/074861
§ 371 (c)(1),
(2) Date: Aug. 12, 2022

(87) PCT Pub. No.: WO2021/159997
PCT Pub. Date: Aug. 19, 2021

(65) Prior Publication Data
US 2023/0068518 A1  Mar. 2, 2023

(30) Foreign Application Priority Data

Feb. 14, 2020 (CN) .......................... 202010093991.8
Apr. 16, 2020 (CN) .......................... 202010302236.6

(51) Int. Cl.
*G06F 3/041* (2006.01)
*G06F 3/044* (2006.01)

(52) U.S. Cl.
CPC ............ *G06F 3/0412* (2013.01); *G06F 3/044* (2013.01); *G06F 3/0416* (2013.01)

(58) Field of Classification Search
CPC .. G06F 3/0412; G06F 3/0416; G06F 3/04164; G06F 3/044; G06F 3/0443;
(Continued)

(56) References Cited

U.S. PATENT DOCUMENTS 9,164,306 B2  10/2015  Lee
9,715,304 B2   7/2017  Berget et al.
(Continued)

FOREIGN PATENT DOCUMENTS

CN  104656965 A  5/2015
CN  104699314 A  6/2015
(Continued)

*Primary Examiner* — Ryan A Lubit
(74) *Attorney, Agent, or Firm* — SLATER MATSIL, LLP

(57) ABSTRACT

This application provides a touch display panel for reducing capacitive load. A package substrate includes a first metal layer and a second metal layer. The second metal layer includes conductive patterns that are arranged in a matrix form. The conductive patterns each output a first sensing signal when sensing a touch operation. Each conductive pattern includes a first area and a second area. The first area includes first metal sub-conducting wires extending in the first direction. A plurality of second metal conducting wires extending in the second direction, any second metal conducting wire is connected to one conductive pattern and is configured to transmit the first sensing signal to a touch controller.

20 Claims, 17 Drawing Sheets

(58) Field of Classification Search
CPC . G06F 2203/04111; G06F 2203/04112; H10K 59/40

See application file for complete search history.

(56) References Cited

U.S. PATENT DOCUMENTS

| | | | |
|---|---|---|---|
| 9,946,414 | B2 | 4/2018 | Wang et al. |
| 10,452,208 | B2* | 10/2019 | Zhai ..................... G06F 3/0412 |
| 10,754,488 | B2 | 8/2020 | Nakayama et al. |
| 11,003,298 | B2* | 5/2021 | Li ....................... G02F 1/13338 |
| 11,042,255 | B2* | 6/2021 | Tominaga ........... G06F 3/04164 |
| 11,747,938 | B2 | 9/2023 | Miyake |
| 2015/0115254 | A1 | 4/2015 | Choi et al. |
| 2016/0259443 | A1* | 9/2016 | Yang .................... G06F 3/0443 |
| 2017/0010712 | A1 | 1/2017 | Yoshizumi et al. |
| 2017/0075456 | A1 | 3/2017 | Lai et al. |
| 2017/0199611 | A1* | 7/2017 | Brunet .................... G06F 3/047 |
| 2018/0373360 | A1 | 12/2018 | Kwak et al. |
| 2019/0129538 | A1 | 5/2019 | Yoshida |
| 2019/0179445 | A1 | 6/2019 | Moon |
| 2019/0302934 | A1 | 10/2019 | Rhe et al. |
| 2019/0302959 | A1 | 10/2019 | Clark et al. |

FOREIGN PATENT DOCUMENTS

| | | |
|---|---|---|
| CN | 106325590 A | 1/2017 |
| JP | 2016081531 A | 5/2016 |
| RU | 2610809 C2 | 2/2017 |
| WO | 2018163672 A1 | 9/2018 |
| WO | 2018168682 A1 | 9/2018 |
| WO | 2020020027 A1 | 1/2020 |

* cited by examiner

TOUCH DISPLAY PANEL AND TOUCH DISPLAY APPARATUS

CROSS REFERENCE TO RELATED APPLICATIONS

This application is a national stage of International Application No. PCT/CN2021/074861, filed on Feb. 2, 2021, which claims priority to Chinese Patent Application No. 202010093991.8, filed on Feb. 14, 2020 and Chinese Patent Application No. 202010302236.6, filed on Apr. 16, 2020. All of the aforementioned applications are hereby incorporated by reference in their entireties.

TECHNICAL FIELD

This application relates to the touch display field, and in particular, to a touch display panel and a touch display apparatus.

BACKGROUND

Currently, an electronic apparatus that can be used for interaction generally includes a touch display panel. A touch structure of the touch display panel includes a plurality of sensing electrodes. For a capacitance touch structure, an area of a touch sensing electrode affects a corresponding capacitance value. Especially for a self-capacitance touch structure, when a touch cable connected to each touch sensing electrode overlaps each touch sensing electrode, capacitive load on the touch cable increases as an area of overlapping with the touch sensing electrode increases. Consequently, drive load of a touch controller (touch sensing integrated circuit) connected to the touch cable increases.

SUMMARY

To resolve the foregoing technical problem, embodiments of this application provide a touch display panel and a touch display apparatus with relatively light capacitive load.

According to a first aspect, in an implementation of this application, a touch display panel includes an array substrate, a display medium layer, and a package substrate that are sequentially stacked. The display medium layer emits light to display an image through cooperation between the array substrate and the package substrate. The package layer includes a first surface and a second surface that are oppositely disposed. The first surface is adjacent to the display medium layer, and the second surface is far away from the display medium layer. A first metal layer and a second metal layer that are mutually insulated are sequentially disposed on the second surface. The second metal layer includes a plurality of conductive patterns that are arranged in a matrix form in a first direction and a second direction. The plurality of conductive patterns each output a first sensing signal through self-capacitance when sensing a touch operation, the first direction is perpendicular to the second direction, each conductive pattern includes a first area and a second area that do not overlap, the first area includes a plurality of first metal sub-conducting wires extending in the first direction, the second area includes at least one second metal sub-conducting wire extending in a direction different from the first direction, and the second metal sub-conducting wire is electrically connected to a plurality of first metal sub-conducting wires in the first area. A plurality of second metal conducting wires extending in the second direction are disposed in the first area corresponding to the first metal layer. The second metal conducting wire does not overlap the first metal sub-conducting wire in the second direction. Any second metal conducting wire is electrically connected to one conductive pattern and is configured to transmit the first sensing signal to a touch controller, and the touch controller is configured to identify a location of the touch operation based on the first sensing signal.

The second metal conducting wire configured to transmit the first sensing signal that is output by the conductive pattern when the conductive pattern senses the touch operation is disposed only in the first area in the conductive pattern, and does not overlap the first metal sub-conducting wire in the extension direction of the second metal conducting wire in the first area except for a point of intersection between the second metal conducting wire and the first metal sub-conducting wire. This effectively reduces an area of overlapping between the second metal conducting wire and the conductive pattern, and further reduces capacitive load on the second metal sub-conducting wire, so that drive load of the touch controller connected to the second metal conducting wire to receive the first sensing signal is reduced.

In an implementation of this application, the array substrate includes a plurality of pixel areas that are arranged in a matrix form, the display medium layer corresponds to each pixel area to form one pixel unit, there is a black matrix between adjacent pixel units, and the pixel unit is configured to emit light to display an image. In the first area, the plurality of first metal sub-conducting wires intersect the plurality of second metal conducting wires to form a plurality of closed metal grids, each metal grid faces the pixel unit and fully overlaps the black matrix, and a shape of the metal grid is the same as a shape of the pixel unit.

That the metal grid faces the pixel unit and fully overlaps the black matrix prevents the metal grid from fully overlapping an area in which light is emitted in the pixel area, so that light brightness is not affected, and image display brightness is further effectively ensured.

In an implementation of this application, the first metal sub-conducting wire is a square-wave-shaped metal conducting wire extending in the first direction, the second metal conducting wire is a rectilinear metal conducting wire extending in the second direction, and two adjacent first metal sub-conducting wires intersect two adjacent second metal conducting wires to form one metal grid.

In an implementation of this application, the first metal sub-conducting wire is a plurality of continuous trapezoidal metal conducting wires extending in the first direction, the second conducting wire is a rectilinear metal conducting wire extending in the second direction, and two adjacent first metal sub-conducting wires intersect two adjacent second metal conducting wires to form one metal grid.

In an implementation of this application, the first metal sub-conducting wire is a triangular-wave-shaped metal conducting wire extending in the first direction, the second conducting wire is a plurality of continuous trapezoidal metal conducting wires extending in the second direction, and two adjacent first metal sub-conducting wires intersect two adjacent second metal conducting wires to form one metal grid.

The first metal sub-conducting wire is disposed only in the first direction in the first area. Therefore, the second metal sub-conducting wire extends only in the second direction, so that a metal grid formed by intersecting the first metal sub-conducting wire and the second metal sub-conducting wire can accurately identify the location of the touch operation, and can further effectively reduce an area of overlapping between the first metal sub-conducting wire and the second metal conducting wire.

In an implementation of this application, the first metal sub-conducting wire and the second conducting wire are triangular-wave-shaped metal conducting wires extending in a same direction, the first metal sub-conducting wire and the second metal conducting wire that are adjacent to each other intersect to form metal grids that are continuously arranged in the extension direction, and one metal grid faces one pixel unit.

In an implementation of this application, the first metal sub-conducting wire is a triangular-wave-shaped metal conducting wire extending in the first direction, and the second conducting wire is a triangular-wave-shaped metal conducting wire extending in the second direction; or the first metal sub-conducting wire is a triangular-wave-shaped metal conducting wire extending in the second direction, and the second conducting wire is a triangular-wave-shaped metal conducting wire extending in the second direction. Two adjacent first metal sub-conducting wires intersect two adjacent second metal conducting wires to form a plurality of metal grids, and one metal grid faces one pixel unit; and two adjacent first metal sub-conducting wires intersect two adjacent second metal conducting wires to form four metal grids, and the four metal grids are arranged in a rectangle form.

In the first area, the first metal sub-conducting wire and the second metal conducting wire extend in the same direction, so that a metal grid formed by intersecting the first metal sub-conducting wire and the second metal conducting wire can effectively reduce an area of overlapping between the first metal sub-conducting wire and the second metal conducting wire, and can further reduce procedure complexity of a metal conducting wire.

In an implementation of this application, one metal grid faces one pixel unit. At a location corresponding to the second metal conducting wire at the second metal layer other than the first metal sub-conducting wire, a floating metal conducting wire having a same material as the first metal sub-conducting wire is disposed at the second metal layer; or at a location corresponding to the second metal conducting wire at the second metal layer other than the first metal sub-conducting wire, a metal conducting wire having a same material as the first metal sub-conducting wire is not disposed at the second metal layer. A first sub-conducting wire at a location at which the first metal sub-conducting wire intersects the second metal conducting wire is floating, so that no conductive capacitance is formed at the location at which the first metal sub-conducting wire intersects the second metal conducting wire, and capacitive load on the second metal conducting wire is further reduced.

In an implementation of this application, the first metal sub-conducting wire is a metal conducting wire that extends in the first direction and that forms a plurality of closed grids, the second conducting wire is a triangular-wave-shaped metal conducting wire extending in the second direction, the second conducting wire does not overlap the metal grid in the second direction, and one metal grid faces four pixel units.

In an implementation of this application, the first metal sub-conducting wire is a metal conducting wire that extends in the first direction and that forms a plurality of closed metal grids, the second conducting wire is a metal conducting wire that extends in the second direction and that forms a plurality of closed metal grids, the metal grids included in the second conducting wire do not overlap the metal grids included in the first metal sub-conducting wire, and one metal grid faces four pixel units.

The first metal sub-conducting wire and the second metal conducting wire are of closed-grid shapes, so that capacitance on the metal conducting wire can be further reduced, and capacitance load on the second metal conducting wire can be further reduced.

In an implementation of this application, the first metal sub-conducting wire is a metal conducting wire that extends in the first direction and that forms a plurality of closed metal grids, and there is one metal connection point between any two adjacent metal grids in the first direction; and the second conducting wire is a metal conducting wire that extends in the second direction and that forms a plurality of closed metal grids, the metal grid on the second conducting wire surrounds one metal conducting wire connection point, and there is at least one metal connection point between any two adjacent second conducting wires.

In an implementation of this application, the first metal sub-conducting wire is a metal conducting wire that extends in the first direction and that forms a plurality of closed metal grids, and there is one metal connection point between any two adjacent metal grids in the first direction; and the second conducting wire is a metal conducting wire that extends in the second direction and that forms a plurality of closed metal grids, the metal grid on the second conducting wire surrounds one metal conducting wire connection point, and any two adjacent second conducting wires surround two adjacent metal connection points.

In the foregoing implementations, in the extension direction of the second metal conducting wire, the second metal conducting wire does not fully overlap a grid line that forms a metal grid. This effectively reduces an area of full overlapping between the second metal conducting wire used as a signal transmission line and the metal conducting wire in the conductive pattern. In addition, the second metal conducting wire is also in a form of a metal grid. This further reduces impedance generated for the transmitted first sensing signal, improves accuracy of transmitting the first touch sensing signal, and reduces drive load of a touch drive module.

In an implementation of this application, in the first area, the metal grid on the first metal sub-conducting wire surrounds one pixel unit at a location that is in the first metal sub-conducting wire and that does not intersect the second conducting wire. This effectively increases an effective area for performing touch sensing by the first metal sub-conducting wire, effectively increases a quantity of output first sensing signals, and ensures touch operation identification accuracy.

In an implementation of this application, at a location that is in the metal grid and that corresponds to the second metal conducting wire, a floating metal conducting wire having a same material as the first metal sub-conducting wire is disposed at the second metal layer, or the first metal sub-conducting wire is not disposed at the second metal layer. In a black matrix between adjacent pixel units, at a location at which the first metal sub-conducting wire and the second metal conducting wire are not disposed on the second surface, a floating metal conducting wire having a same material as the first metal sub-conducting wire is disposed at the second metal layer, or the first metal sub-conducting wire is not disposed at the second metal layer.

A floating first conducting wire is disposed or no metal conducting wire is disposed at a location that is in a closed metal grid and at which a corresponding pixel unit emits light. This can effectively reduce an area of overlapping between the first metal sub-conducting wire and the second metal conducting wire, further reduce signal interference between metal conducting wires, and ensure signal transmission accuracy.

In an implementation of this application, at locations at which the plurality of first metal sub-conducting wires intersect the plurality of second metal conducting wires, a dielectric material is disposed between the second metal layer and the first metal layer. This prevents the first sensing signal transmitted by the second metal conducting wire from being interfered with.

In an implementation of this application, at locations at which the plurality of first metal sub-conducting wires intersect the plurality of second metal conducting wires, a metal conducting wire material of the first metal sub-conducting wire is not disposed at the second metal layer; or at locations at which the plurality of first metal sub-conducting wires intersect the plurality of second metal conducting wires, a floating first metal sub-conducting wire is disposed at the second metal layer. A first sub-conducting wire at a location at which the first metal sub-conducting wire intersects the second metal conducting wire is floating, so that no conductive capacitance is formed at the location at which the first metal sub-conducting wire intersects the second metal conducting wire, and capacitive load on the second metal conducting wire is further reduced.

In an implementation of this application, the second area includes a plurality of second metal sub-conducting wires, and the plurality of second metal sub-conducting wires form a plurality of metal grids. In an area other than the second metal conducting wire, a conductive pattern includes a plurality of metal grids. The metal grid can effectively reduce impedance of the conductive pattern, and further reduce load of the touch controller.

In an implementation of this application, a first dielectric layer is sandwiched between the first metal layer and the second metal layer. In the first area, the first dielectric layer includes a first via, and the second metal conducting wire is electrically connected to the conductive pattern through the first via. A second metal conducting wire is electrically connected to a corresponding conductive pattern accurately through the first via, so as to accurately transmit, to the touch controller, the first sensing signal that is output by the conductive pattern.

In an implementation of this application, there is a black matrix between adjacent pixel units, and the first metal sub-conducting wire, the second metal sub-conducting wire, and the second metal conducting wire all face the black matrix. That the metal conducting wire faces the pixel unit and fully overlaps the black matrix prevents the metal conducting wire from blocking an area in which light is emitted in the pixel area, so that image display brightness is further effectively ensured.

In an implementation of this application, the display medium layer is an organic light-emitting diode, and a touch structure that includes conductive patterns included in the first metal layer and the second layer and the second metal cable and that is used for touch sensing is directly disposed on a surface of the organic light-emitting diode. This effectively reduces thickness of the touch display panel.

In an implementation of this application, the touch display panel further includes a protective layer, and the protective layer covers the first metal layer and the second metal layer that are disposed on the second surface of the package substrate.

According to a second aspect, in an implementation of this application, a touch display apparatus includes the foregoing touch display panel and a touch controller. The touch controller is configured to identify, based on a received sensing signal, a location of a touch operation received by the touch display panel. The touch controller is located in an area other than an area in which a conductive pattern is disposed on the touch display panel, or the touch controller is disposed in an area other than the touch display panel.

DETAILED DESCRIPTION OF ILLUSTRATIVE EMBODIMENTS

The following describes this application by using specific embodiments.

Figure 1:
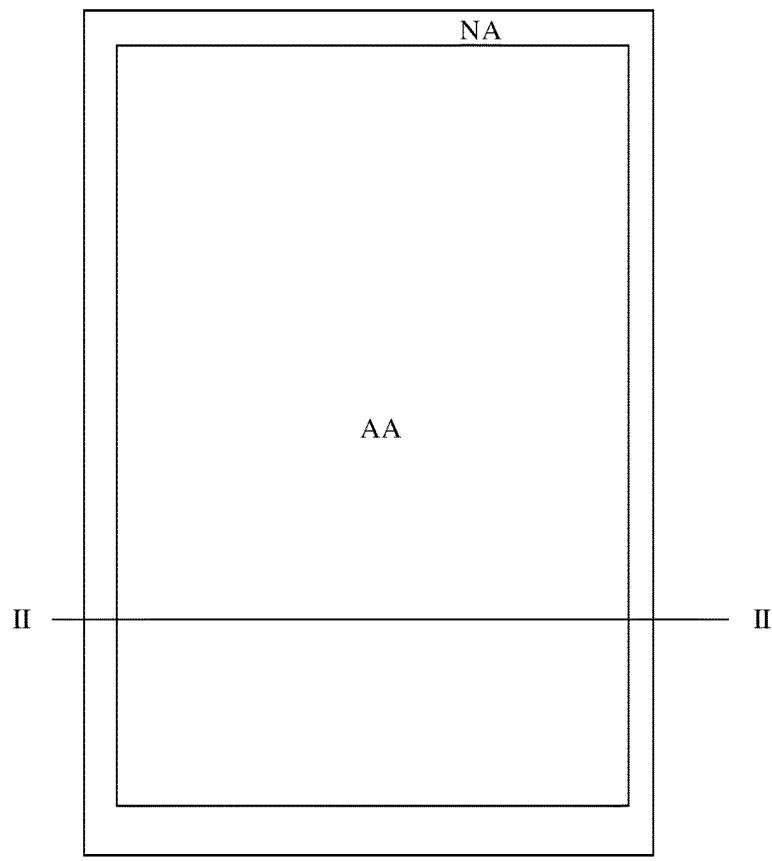
FIG. 1 is a schematic diagram of a plane structure of a touch display panel according to an embodiment of this application.

FIG. 1 is a schematic diagram of a plane structure of a touch display panel 10 according to an embodiment of this application.

The touch display panel 10 includes an active area AA (active area) and a non-active area NA (non-active area). The active area AA is disposed on the touch display panel 10 as a picture display area, and is configured to display an image. The non-active area NA is configured to dispose function modules such as a display drive control module and a touch drive control module. The touch display panel 10 may be applied to a touch display apparatus, for example, an electronic apparatus, such as a mobile phone or a tablet computer, that can perform display and touch functions.

Figure 2:
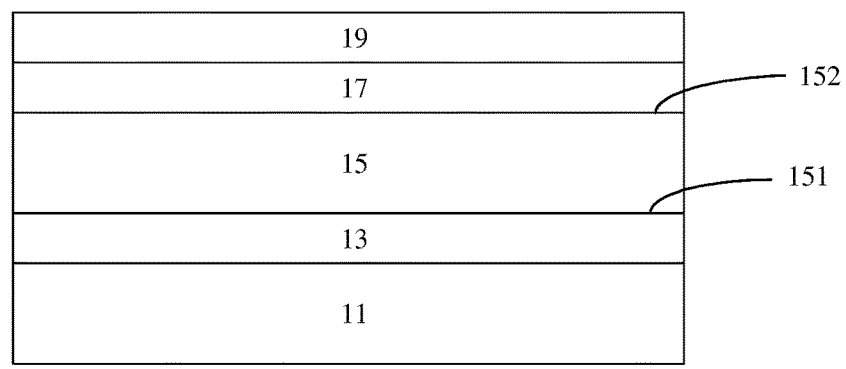
FIG. 2 is a schematic diagram of a cross-sectional structure of the touch display panel shown in FIG. 1 along an II-II line.

FIG. 2 is a schematic diagram of a cross-sectional structure of the touch display panel 10 shown in FIG. 1 along an II-II line.

As shown in FIG. 2, the touch display panel 10 is configured to implement image display and touch operation detection. In this embodiment, the touch display panel 10 includes an array substrate 11, a display medium layer 13, and a package substrate 15 that are sequentially stacked from bottom to top in the figure. The display medium layer 13 is sandwiched between the array substrate 11 and the package substrate 15.

In this embodiment, the display medium layer 13 is an organic light-emitting diode (Organic Light-Emitting Diode, OLED); pixel areas that are arranged in a matrix form are disposed on the array substrate 11, and a drive circuit configured to drive the display medium layer 13 to emit light is disposed in each pixel area; and the package substrate 15 is configured to package the display medium layer 13. The drive circuit is configured to drive a material of the display medium layer to emit light to display an image.

In this embodiment, the package substrate 15 includes two opposite surfaces: a first surface 151 and a second surface 152. The first surface is adjacent to the display medium layer 13, and the second surface 152 is far away from the display medium layer 13. A touch sensing layer 17 and a protective layer 19 are sequentially disposed on the second surface 152. The touch sensing layer 17 is configured to identify a location of touch performed on the touch display panel 10. The protective layer 19 is configured to protect layer structures such as the touch sensing layer 17 and the package layer substrate 15.

In this embodiment, when the display medium layer 13 is an organic light-emitting diode, the touch display panel 10 may be made into a flexible and bent panel structure, and therefore can be applied to a flexible touch display apparatus, for example, a foldable mobile phone or a tablet computer.

Figure 3:
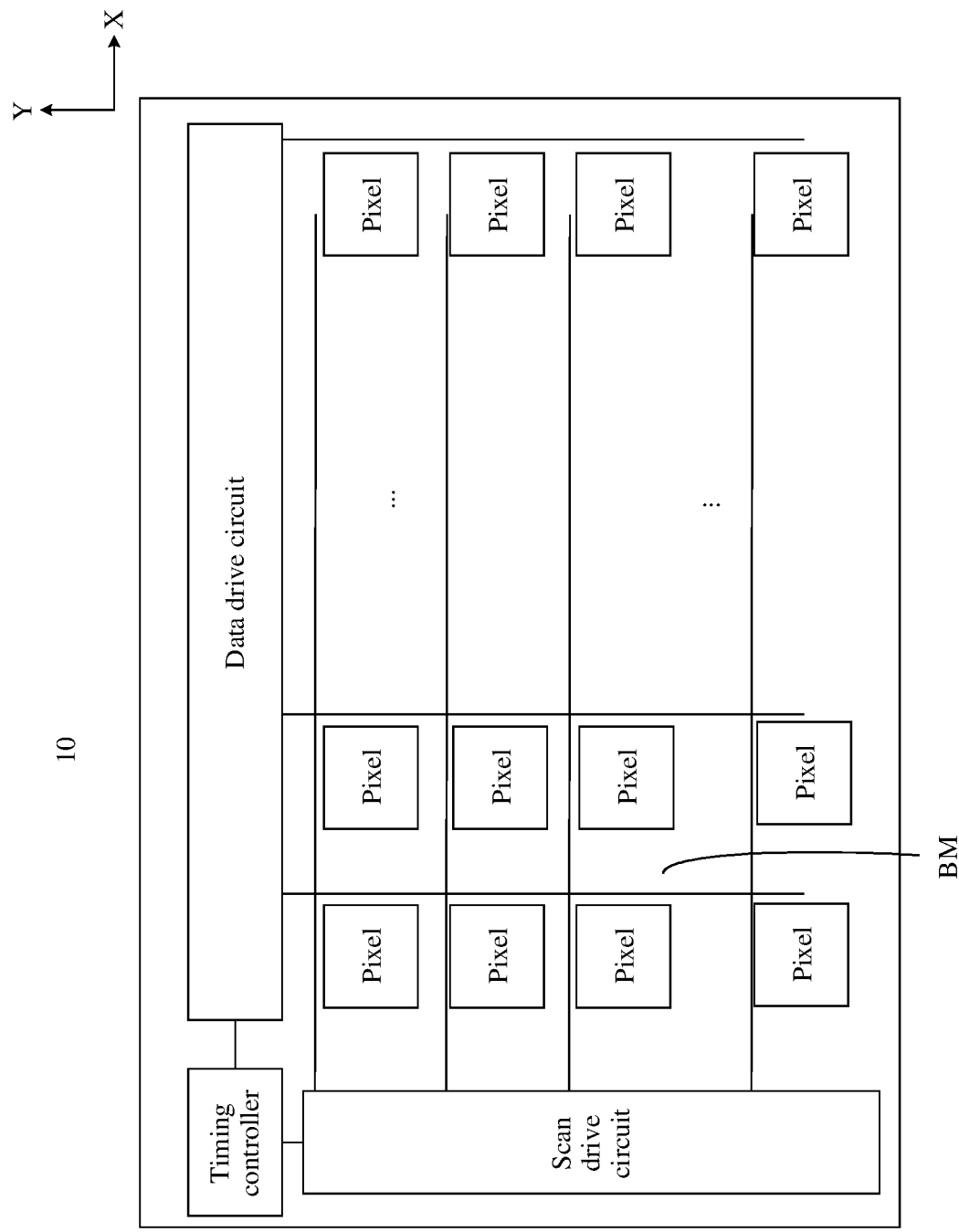
FIG. 3 is a schematic diagram of a plane structure of a pixel area on an array substrate shown in FIG. 1.

FIG. 3 is a schematic diagram of a plane structure of a pixel area on the array substrate 11 shown in FIG. 1.

As shown in FIG. 3, in the active area AA, a plurality of pixel areas (not shown) that are arranged in a matrix form in a first direction X and a second direction Y are disposed on a surface that is of the array substrate 11 and that is adjacent to the display medium layer 13. A drive circuit is disposed in each pixel area. A thin-film transistor and a capacitor included in the drive circuit may be formed by depositing and etching a semiconductor material on the surface of the array substrate.

In this embodiment, a shape of the pixel area may be set according to an actual requirement, for example, may be a square, a diamond, a pentagon, or a hexagon. Certainly, the foregoing shape of the pixel area is merely an example for description, and no limitation is imposed thereto.

The drive circuit in each pixel area can drive a light-emitting material that faces the pixel area and that is included in the display medium layer 13 to emit light. In this embodiment, a drive circuit in a pixel area cooperates with the corresponding display medium layer 13 to form one pixel unit (Pixel).

Adjacent pixel units (Pixels) may correspond to different light-emitting materials included in the display medium layer 13 to emit light of different colors. Preferably, there is a black matrix (BM) between adjacent pixel units (Pixels), to prevent light emitted between the adjacent pixel units (Pixels) from interfering with each other.

In the non-active area NA, a display drive circuit configured to drive the drive circuit in each pixel area and a touch controller TC (FIG. 4) are disposed. The display drive circuit includes a data drive circuit configured to provide an image data signal, a scan drive circuit configured to perform line scanning, and a timing controller (Tcon) configured to control operating timing of the data drive circuit and the scan drive circuit.

Figure 4:
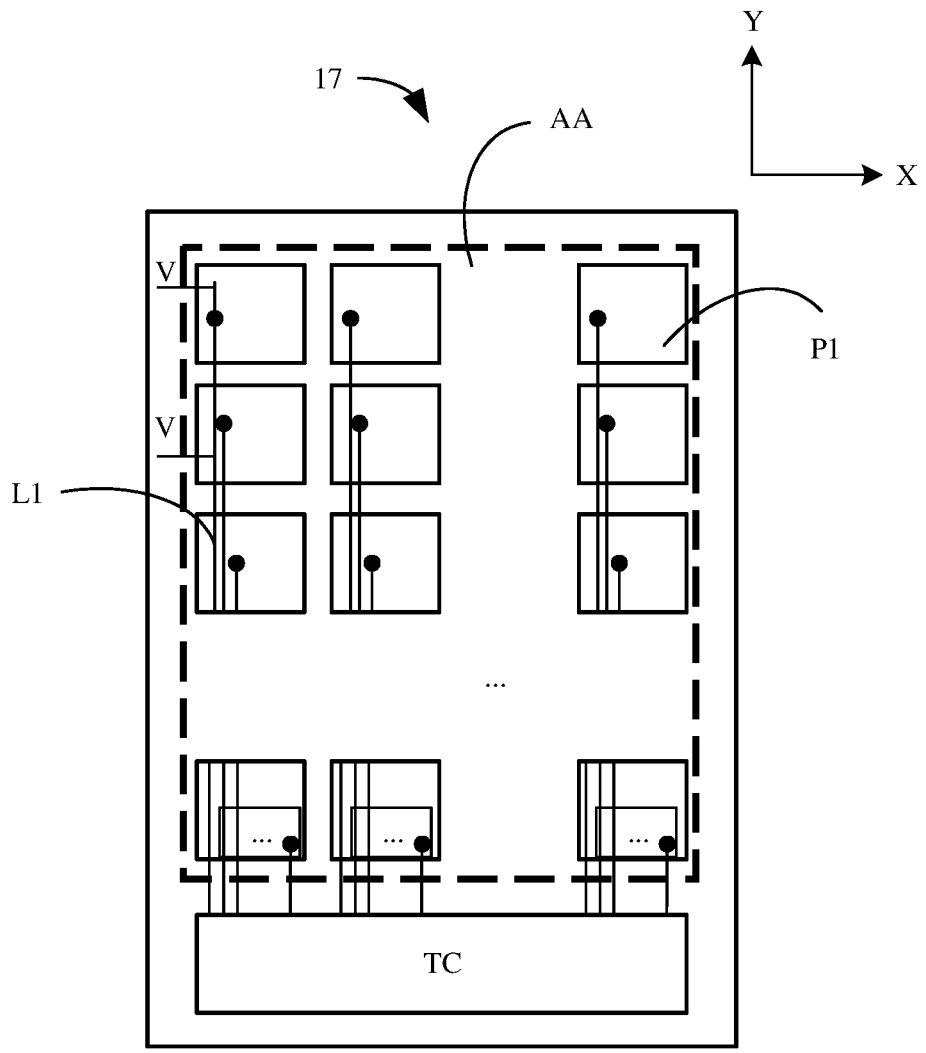
FIG. 4 is a schematic diagram of a plane structure of a touch sensing layer disposed on a package substrate shown in FIG. 1.

FIG. 4 is a schematic diagram of a plane structure of the touch sensing layer 17 disposed on the package substrate 15 shown in FIG. 1.

As shown in FIG. 4, the touch sensing layer 17 includes a plurality of conductive patterns P1 that are arranged in a matrix form in the first direction X and the second direction Y. Each conductive pattern P1 is electrically connected to the touch controller TC through a signal transmission line Li extending in the second direction Y.

In this embodiment, the conductive pattern P1 is used to sense a first sensing signal generated in response to user touch, and transmit the first sensing signal to the touch controller TC through the signal transmission line Li. The touch controller TC identifies a location of the touch operation based on the first sensing signal. In this embodiment, the touch sensing layer 17 implements self-capacitance touch sensing by using the conductive pattern. In this embodiment, the conductive pattern is of a grid shape formed by metal conducting wires.

Figure 5:
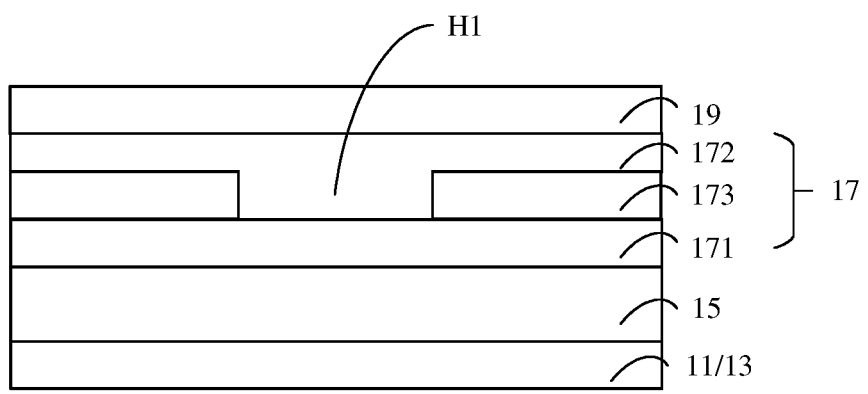
FIG. 5 is a schematic diagram of a side surface structure of one conductive pattern in two adjacent conductive patterns shown in FIG. 4 along a V-V line.
Figure 6:
FIG. 6 is a schematic diagram of a side surface structure of the other conductive pattern in the two adjacent conductive patterns shown in FIG. 4 along a V-V line.

More specifically, FIG. 5 and FIG. 6 are respectively schematic diagrams of side surface structures of two adjacent conductive patterns on the touch display panel shown in FIG. 4 along a V-V line. FIG. 5 is a schematic diagram of a side surface structure of one conductive pattern in the two adjacent conductive patterns shown in FIG. 4 along the V-V line. FIG. 6 is a schematic diagram of a side surface structure of the other conductive pattern in the two adjacent conductive patterns shown in FIG. 4 along the V-V line.

As shown in FIG. 5 and FIG. 6, the touch sensing layer 17 includes a first metal layer 171, an insulation dielectric layer 173, and a second metal layer 172 that are sequentially stacked. The first metal layer 171 includes the signal transmission line Li shown in FIG. 4. The second metal layer 172 includes a plurality of conductive patterns P1 that are arranged in a matrix form.

The first metal layer 171 and the second metal layer 172 belong to different layer structures. As shown in FIG. 5, at a location at which the signal transmission line Li is electrically connected to the conductive pattern, a through-hole H1 is disposed at the insulation dielectric layer 173, and the first metal layer 171 is electrically connected to the second metal layer 172 by using a conductive material in the first through-hole H1. As shown in FIG. 6, at a location at which the signal transmission line Li is not electrically connected to the conductive pattern P1, the insulation dielectric layer 173 insulates the first metal layer 171 from the second metal layer 172, to prevent the first metal layer from being electrically connected to the second metal layer.

In this embodiment, a first conductive pattern P1 and the signal transmission line Li may be formed through etching or printing by using a patterned photomask.

Figure 7:
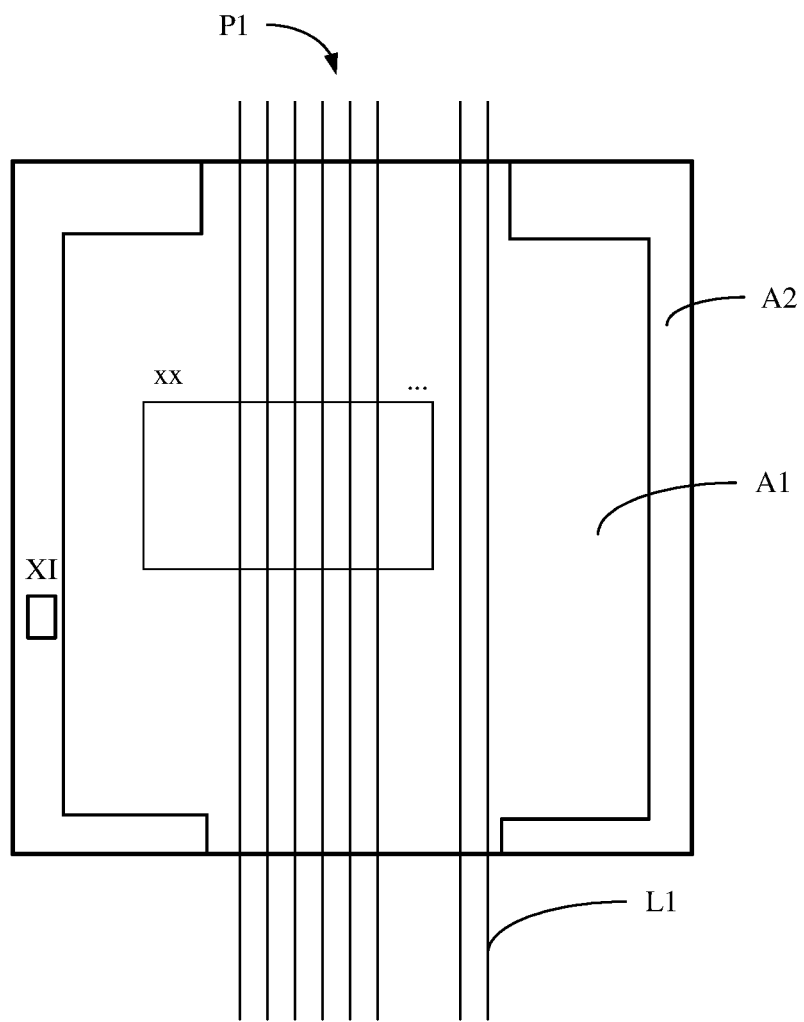
FIG. 7 is a schematic diagram of a plane structure of any conductive pattern shown in FIG. 4.

FIG. 7 is a schematic diagram of a plane structure of any conductive pattern P1 shown in FIG. 4.

As shown in FIG. 7, an area in which each conductive pattern P is located includes a first area A1 and a second area A2 that do not overlap. Some metal conducting wires in the conductive pattern P1 and the signal transmission line Li are correspondingly disposed in the first area A1. In this case, the second area A2 does not include the signal transmission line Li, but includes only a metal conducting wire in the conductive pattern. In other words, the signal transmission line Li is disposed only in the first area A1 but not in the second area A2, and does not overlap the second area A2.

Figure 8:
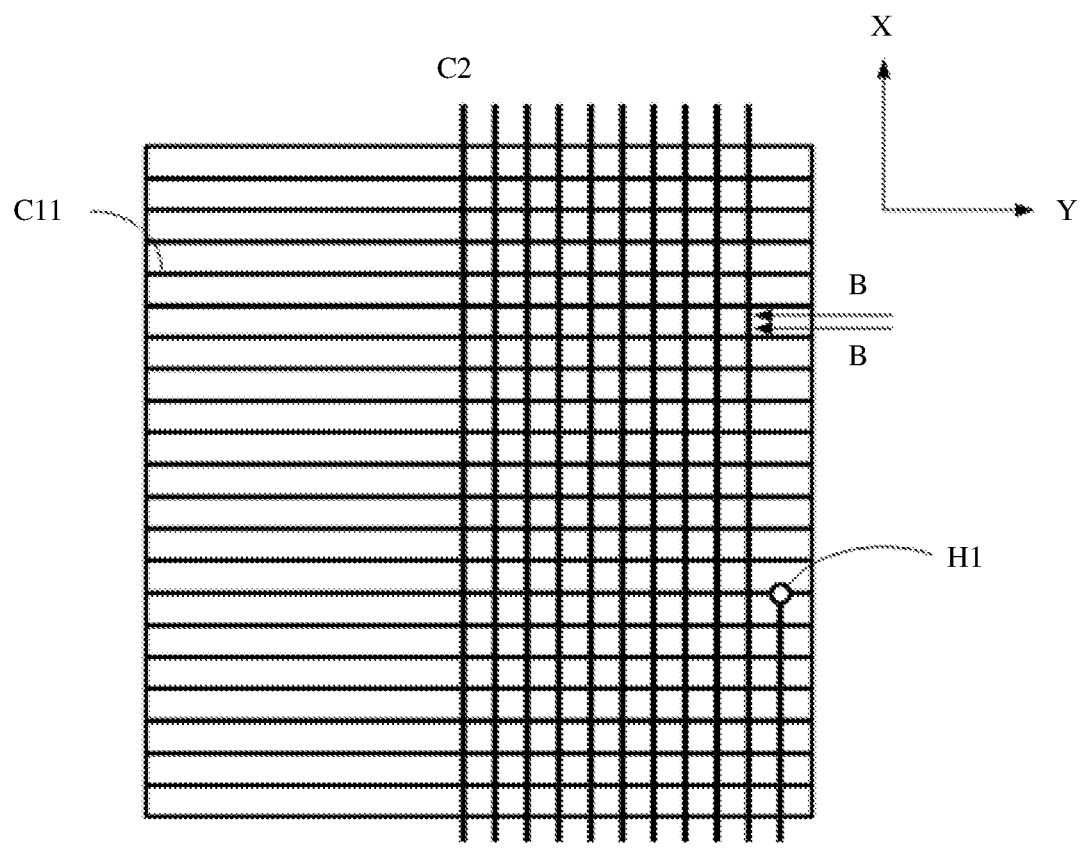
FIG. 8 is a schematic diagram of an enlarged structure of a first area in the any conductive pattern shown in FIG. 7 along an xx line according to a first embodiment of this application.

FIG. 8 is a schematic diagram of an enlarged structure of the first area A1 in the any conductive pattern shown in FIG. 7 along an xx line according to a first embodiment of this application.

As shown in FIG. 8, in the first area A1, a plurality of first metal sub-conducting wires C11 extending in the first direction X are disposed at the second metal layer 172, and the plurality of first metal conducting wires C11 are disposed at a preset distance from each other. In other words, the plurality of first metal sub-conducting wires C11 are disposed in parallel in the second direction Y, and two adjacent first metal sub-conducting wires C11 are spaced at the preset distance.

In the second area A2, at least one second metal sub-conducting wire C12 extending in a direction different from the first direction X is disposed, and the second metal sub-conducting wire C12 is electrically connected to a plurality of first metal sub-conducting wires C11 in the first area A1. Therefore, the first metal sub-conducting wires C11 discretely disposed in the first area A1 are electrically connected to and conducted with the metal conducting wire in the second area A2, so that all metal conducting wires in the first conductive pattern P1 are electrically connected and are at a same potential.

A plurality of second metal conducting wires C2 extending in the second direction Y are disposed in the first area A1 corresponding to the first metal layer 171. The second metal conducting wire C2 does not continuously overlap the first metal sub-conducting wire C11 in the extension direction (the second direction Y) of the second metal conducting wire. In other words, the second metal conducting wire C2 and the first metal sub-conducting wire C11 do not overlap except for a point of intersection between the second metal conducting wire and the first metal sub-conducting wire in the extension directions thereof. Any second metal conducting wire C2 is electrically connected to one conductive pattern. In this embodiment, the second metal conducting wire C2 is used as the signal transmission line Li shown in FIG. 7, and is configured to transmit a first sensing signal provided by the conductive pattern electrically connected to the second metal conducting wire to the touch controller TC.

In addition, a plurality of second metal conducting wires C2 extending in the second direction Y are disposed at the first metal layer 171, and when the first metal layer 171 and the second metal layer 172 are stacked, in other words, when the plurality of first metal sub-conducting wires C11 at the second metal layer 172 are projected onto the first metal layer 171 in a direction perpendicular to the first metal layer 171, the plurality of first metal sub-conducting wires C11 intersect the plurality of second metal conducting wires C12 to form a plurality of closed metal grids.

In an embodiment of this application, each metal grid faces one pixel unit (Pixel), and a shape of the metal grid is the same as a shape of the pixel unit, so that a metal conducting wire is located on a light shield layer. This prevents a metal conducting wire from blocking a light-emitting area of a pixel unit (Pixel), and ensures transmittance and intensity of light emitted by the pixel unit (Pixel) and image brightness.

In the first area A1, a first dielectric layer includes a first via H1, and the second metal conducting wire C2 is electrically connected to the conductive pattern P1 through the first via H1. In other words, the second metal conducting wire C2 used as the signal transmission line Li is electrically connected to the conductive pattern P1 through the first via H1.

Figure 9:
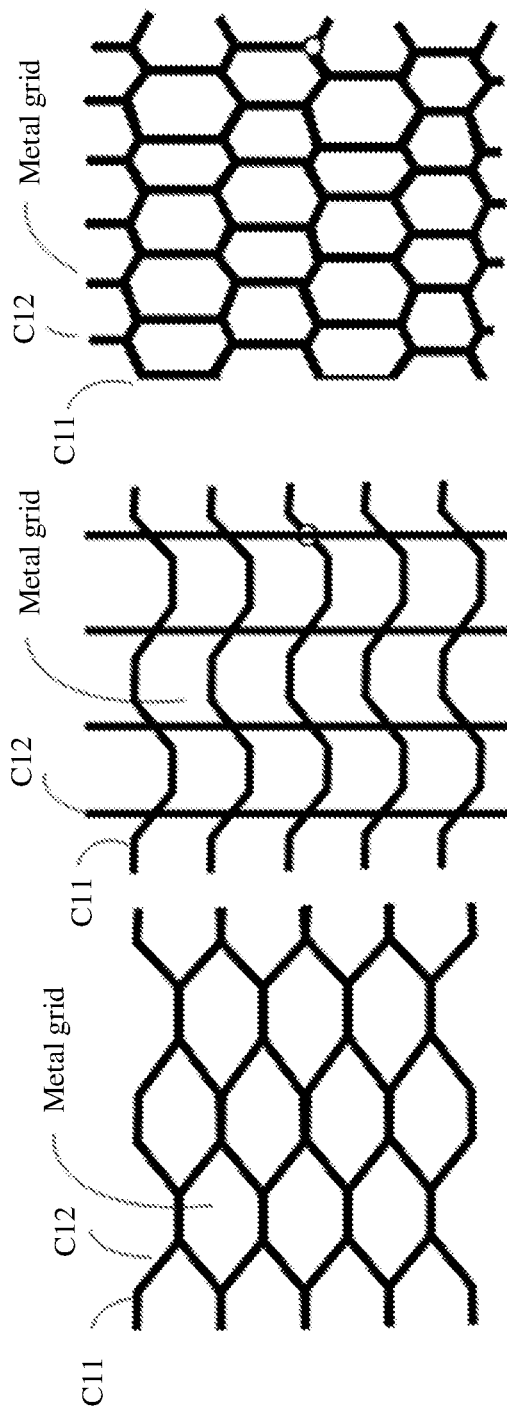
FIG. 9(a), FIG. 9(b), and FIG. 9(c) are a schematic diagram of an enlarged structure of a second area in the any conductive pattern shown in FIG. 7 along an XI line.

FIG. 9(a), FIG. 9(b), and FIG. 9(c) are a schematic diagram of an enlarged structure of the second area A2 in the any conductive pattern shown in FIG. 7 along an XI line.

As shown in FIG. 9(a), FIG. 9(b), and FIG. 9(c), in addition to a plurality of first metal sub-conducting wires C11 extending in the first direction X, the second area A2 further includes a plurality of second metal sub-conducting wires C12 extending in the second direction Y. The plurality of second metal sub-conducting wires C11 intersect the plurality of second metal sub-conducting wires C12 to form patterns of a plurality of metal grids. The plurality of second metal sub-conducting wires C11 and the plurality of second metal sub-conducting wires C12 are disposed at a same layer, and are electrically connected at intersection locations.

In this embodiment, a pattern shape of a metal grid formed in the second area A2 may be a hexagon formed by intersecting continuous trapezoidal first metal sub-conducting wires C11 extending in the first direction X and triangular-wave-shaped second metal conducting wires C2 extending in the second direction Y, as shown in FIG. 9(a); or may be an irregular shape formed by intersecting continuous trapezoidal first metal sub-conducting wires C11 extending in the first direction X and rectilinear second metal conducting wires C2 extending in the second direction Y, as shown in FIG. 9(b); or may be a hexagon formed by intersecting continuous triangular-wave-shaped first metal sub-conducting wires C11 extending in the first direction X and continuous trapezoidal second metal conducting wires C2 extending in the second direction Y, as shown in FIG. 9(c). Certainly, the shape of the metal grid in the second area A2 is not limited to the foregoing enumerated shapes, and it only needs to be ensured that the shape of the metal grid and the shape of the pixel area are the same and fully overlap.

The metal grid pattern formed in the second area A2 may be obtained by patterning a material of the second metal layer 172.

In this embodiment, the first metal sub-conducting wire C11, the second metal sub-conducting wire C12, and the second metal conducting wire are all disposed to face the black matrix BM. This effectively prevents display brightness of a pixel unit (Pixel) from being affected when a metal conducting wire fully overlaps an edge of a pixel area.

At a location corresponding to the second metal conducting wire C2 at the second metal layer 172 other than a location of the first metal sub-conducting wire C11, a floating metal conducting wire having a same material as the first metal sub-conducting wire C11 may be disposed. Certainly, at a location corresponding to the second metal conducting wire C2 at the second metal layer 172, the first metal sub-conducting wire C11 may alternatively not be disposed.

Figure 10:
FIG. 10 is a schematic diagram of a cross-sectional structure of the conductive pattern shown in FIG. 8 along a B-B line.

Specifically, FIG. 10 is a schematic diagram of a cross-sectional structure of the conductive pattern shown in FIG. 8 along a B-B line. As shown in FIG. 10, in this embodiment, at a location corresponding to the second metal conducting wire C2 at the second metal layer 172 other than a location of the first metal sub-conducting wire C11, a floating (floating) metal conducting wire having a same material as the first metal sub-conducting wire C11 is disposed. In this embodiment, a part of the floating metal conducting wire is not electrically connected to a ground terminal of the touch display panel. The floating metal conducting wire is disposed, so that the part of the metal conducting wire is not affected by electrical performance of the ground terminal. This further reduces signal interference between the first metal sub-conducting wires C11 and between the first metal sub-conducting wire C11 and the second metal conducting wire C2, so that the second metal conducting wire C2 used as the signal transmission line Li accurately transmits the first sensing signal sensed by the conductive pattern to the touch sensing module TC.

Figure 11:
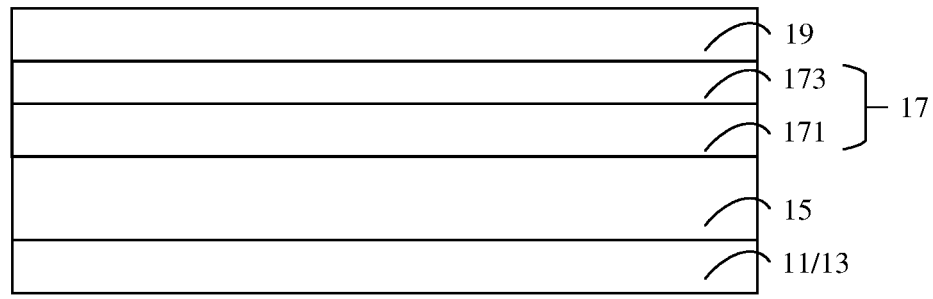
FIG. 11 is a schematic diagram of a cross-sectional structure of the conductive pattern shown in FIG. 8 along a B-B line according to a second embodiment of this application.

FIG. 11 is a schematic diagram of a cross-sectional structure of the conductive pattern shown in FIG. 8 along a B-B line according to a second embodiment of this application. As shown in FIG. 11, in this embodiment, at a location corresponding to the second metal conducting wire C2 at the second metal layer 172 other than a location of the first metal sub-conducting wire C11, the first metal sub-conducting wire C11 is not disposed at the second metal layer 172. This prevents a case in which the second metal conducting wire C2 used as the signal transmission line Li is electrically connected to the conductive pattern to mistakenly transmit an electrical signal sensed by the conductive pattern to the touch sensing module TC, and ensures accuracy of a touch sensing signal.

Figure 12:
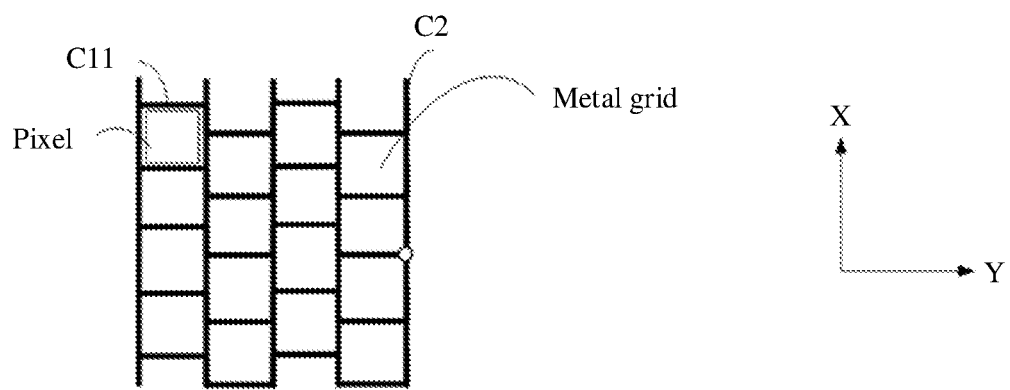
FIG. 12 is a schematic diagram of an enlarged structure of the any conductive pattern shown in FIG. 7 along an xx line according to a third embodiment of this application.
Figure 13:
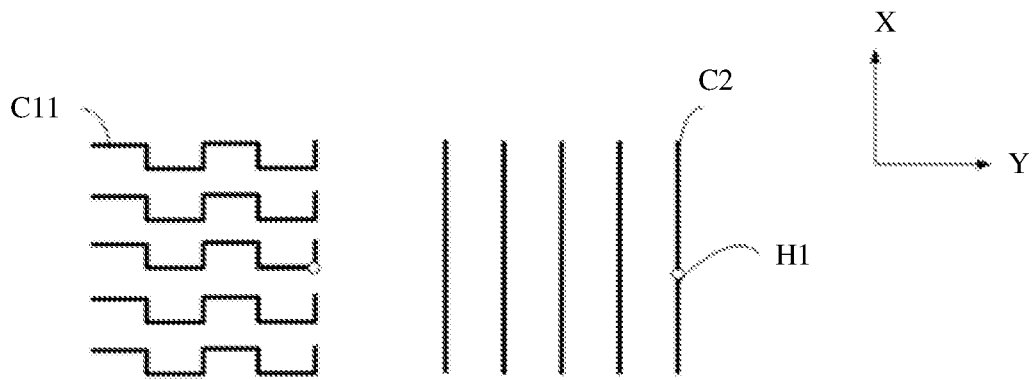
FIG. 13 is a schematic diagram of an exploded structure of a first metal sub-conducting wire and a second metal conducting wire in the conductive pattern shown in FIG. 12.

FIG. 12 is a schematic diagram of an enlarged structure of the any conductive pattern shown in FIG. 7 along an xx line according to a third embodiment of this application. FIG. 13 is a schematic diagram of an exploded structure of the first metal sub-conducting wire C11 and the second metal conducting wire C2 in the conductive pattern shown in FIG. 12.

As shown in FIG. 12 and FIG. 13, the first metal sub-conducting wire C11 is a square-wave-shaped metal conducting wire extending in the first direction X, and the second metal conducting wire C2 is a rectilinear metal conducting wire extending in the second direction Y. Two adjacent first metal sub-conducting wires C11 intersect two adjacent second metal conducting wires C2 to form one square metal grid, and a shape and a size of one metal grid are substantially the same as a shape and a size of a pixel unit (Pixel). In this embodiment, preferably, the metal grid faces the black matrix BM (FIG. 3) and surrounds the pixel unit (Pixel). This effectively prevents display brightness of a pixel unit (Pixel) from being affected when a metal conducting wire fully overlaps an edge of a pixel area.

Figure 14:
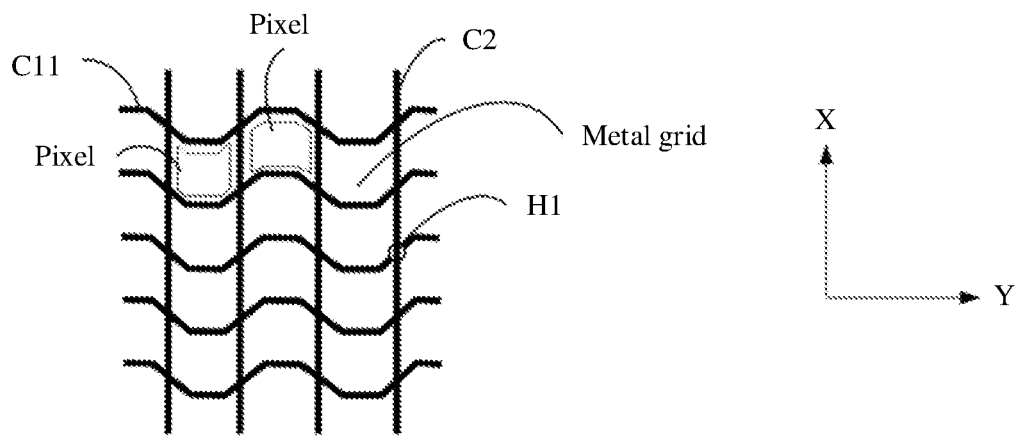
FIG. 14 is a schematic diagram of an enlarged structure of the any conductive pattern shown in FIG. 7 along an xx line according to a fourth embodiment of this application.
Figure 15:
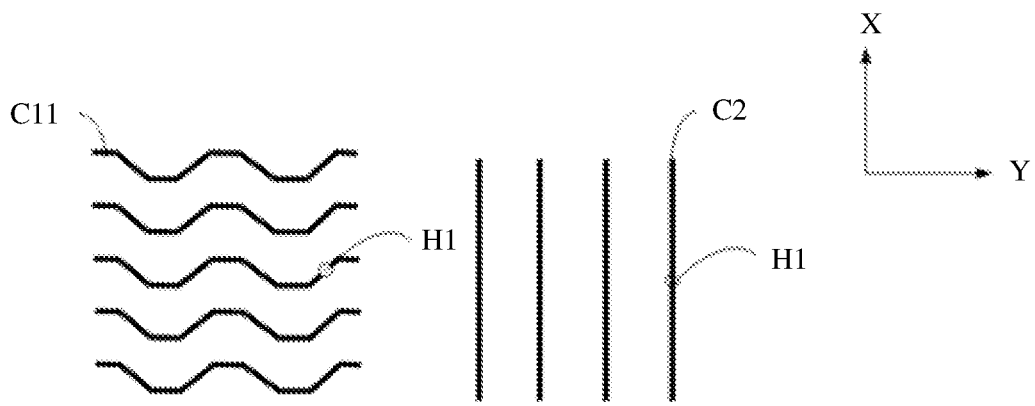
FIG. 15 is a schematic diagram of an exploded structure of a first metal sub-conducting wire and a second metal conducting wire in the conductive pattern shown in FIG. 14.

FIG. 14 is a schematic diagram of an enlarged structure of the any conductive pattern shown in FIG. 7 along an xx line according to a fourth embodiment of this application. FIG. 15 is a schematic diagram of an exploded structure of the first metal sub-conducting wire C11 and the second metal conducting wire C2 in the conductive pattern shown in FIG. 14.

As shown in FIG. 14 and FIG. 15, the first metal sub-conducting wire C11 is a plurality of continuous trapezoidal metal conducting wires extending in the first direction X, and the second metal conducting wire C2 is a rectilinear metal conducting wire extending in the second direction Y. Two first metal sub-conducting wires C11 intersect two adjacent second metal conducting wires C2 to form one irregular polygonal metal grid, and a shape and a size of one metal grid are substantially the same as a shape and a size of a pixel unit (Pixel). In this embodiment, the metal grid faces the black matrix BM and surrounds the pixel unit (Pixel). This effectively prevents display brightness of a pixel unit (Pixel) from being affected when a metal conducting wire fully overlaps an edge of a pixel area.

Figure 16:
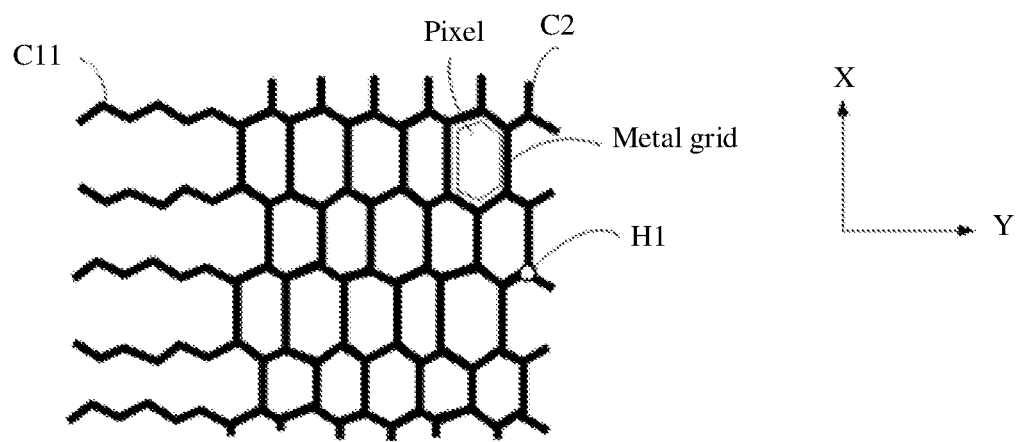
FIG. 16 is a schematic diagram of an enlarged structure of the any conductive pattern shown in FIG. 7 along an xx line according to a fifth embodiment of this application.
Figure 17:
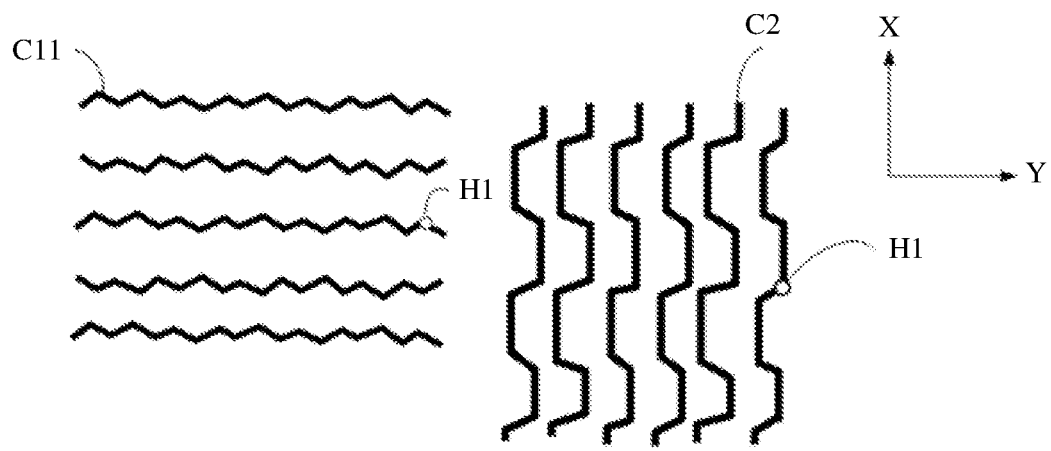
FIG. 17 is a schematic diagram of an exploded structure of a first metal sub-conducting wire and a second metal conducting wire in the conductive pattern shown in FIG. 16.

FIG. 16 is a schematic diagram of an enlarged structure of the any conductive pattern shown in FIG. 7 along an xx line according to a fifth embodiment of this application. FIG. 17 is a schematic diagram of an exploded structure of the first metal sub-conducting wire C11 and the second metal conducting wire C2 in the conductive pattern shown in FIG. 16.

As shown in FIG. 16 and FIG. 17, the first metal sub-conducting wire C11 is a triangular-wave-shaped metal conducting wire extending in the first direction X, and the second metal conducting wire C2 is a plurality of continuous trapezoidal metal conducting wires extending in the second direction Y. Two first metal sub-conducting wires C11 intersect two adjacent second metal conducting wires C2 to form one hexagonal metal grid, and a shape and a size of one metal grid are substantially the same as a shape and a size of a pixel unit (Pixel). In this embodiment, the metal grid faces the black matrix BM and surrounds the pixel unit (Pixel). This effectively prevents display brightness of a pixel unit (Pixel) from being affected when a metal conducting wire fully overlaps an edge of a pixel area.

In another embodiment of this application, compared with those shown in FIG. 16 and FIG. 17, the extension direction of the first metal sub-conducting wire C11 and the extension direction of the second metal conducting wire C2 may be exchanged. In other words, the first metal sub-conducting wire C11 shown in FIG. 16 is a triangular-wave-shaped metal conducting wire extending in the second direction Y, and the second metal conducting wire C2 is a plurality of continuous trapezoidal metal conducting wires extending in the first direction X.

Figure 18:
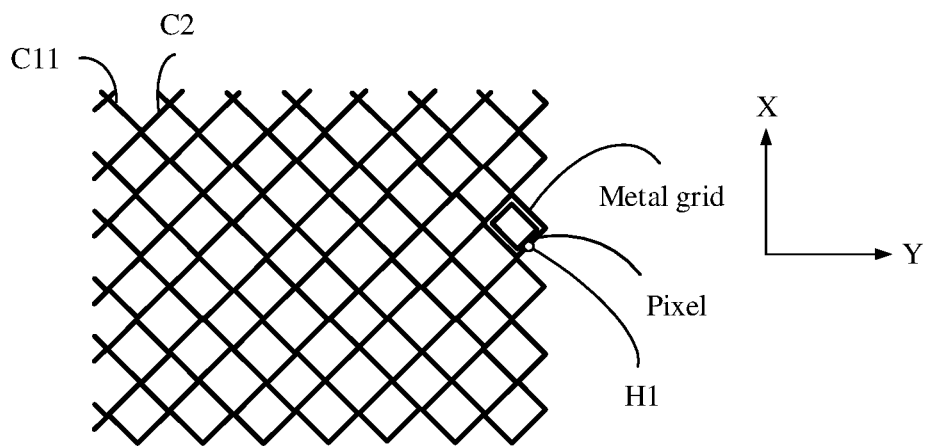
FIG. 18 is a schematic diagram of an enlarged structure of the any conductive pattern shown in FIG. 7 along an xx line according to a sixth embodiment of this application.
Figure 19:
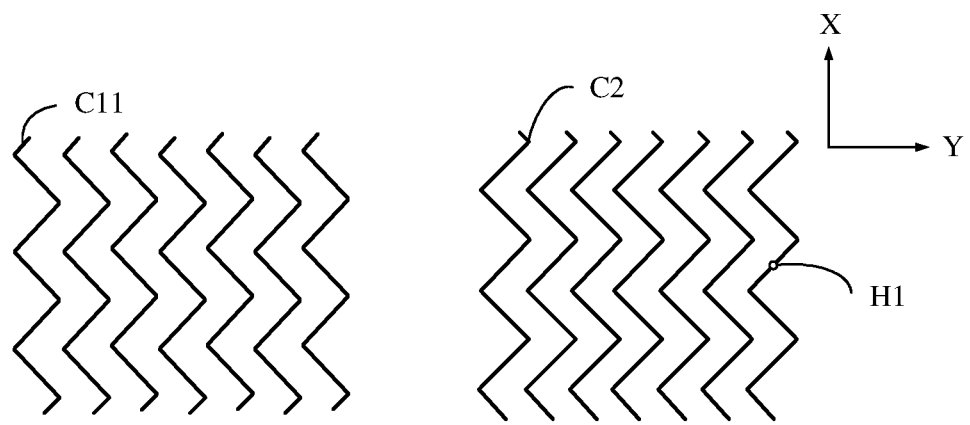
FIG. 19 is a schematic diagram of an exploded structure of a first metal sub-conducting wire and a second metal conducting wire in the conductive pattern shown in FIG. 18.

FIG. 18 is a schematic diagram of an enlarged structure of the any conductive pattern shown in FIG. 7 along an xx line according to a sixth embodiment of this application. FIG. 19 is a schematic diagram of an exploded structure of the first metal sub-conducting wire C11 and the second metal conducting wire C2 in the conductive pattern shown in FIG. 18.

As shown in FIG. 18 and FIG. 19, the first metal sub-conducting wire C11 and the second metal conducting wire C2 are continuous Z-shaped metal conducting wires extending in a same direction. In this embodiment, the first metal sub-conducting wire C11 is a triangular-wave-shaped metal conducting wire extending in the second direction Y, and the second metal conducting wire C2 is a triangular-wave-shaped metal conducting wire extending in the second direction Y. In another embodiment of this application, the first metal sub-conducting wire C11 is a triangular-wave-shaped metal conducting wire extending in the first direction X, and the second metal conducting wire C2 is a triangular-wave-shaped metal conducting wire extending in the first direction X.

In this embodiment, one second metal conducting wire C2 is disposed between two adjacent first metal sub-conducting wires C11, and one first metal sub-conducting wire C11 is disposed between two adjacent second metal conducting wires C2. Therefore, one first metal sub-conducting wire C11 intersects one second metal conducting wire C2 to form quadrilateral metal grids that are sequentially arranged in the second direction Y. In addition, two adjacent first metal sub-conducting wires C11 intersect two adjacent second metal conducting wires C2 to form a quadrilateral including four metal grids. In this embodiment, the metal grid is a diamond arranged in the second direction Y, the four metal grids are arranged in a diamond shape, and a shape and a size of one metal grid are substantially the same as a shape and a size of a pixel unit (Pixel).

In this embodiment, the metal grid faces the black matrix BM. This effectively prevents display brightness of a pixel unit (Pixel) from being affected when a metal conducting wire fully overlaps an edge of a pixel area.

Figure 20:
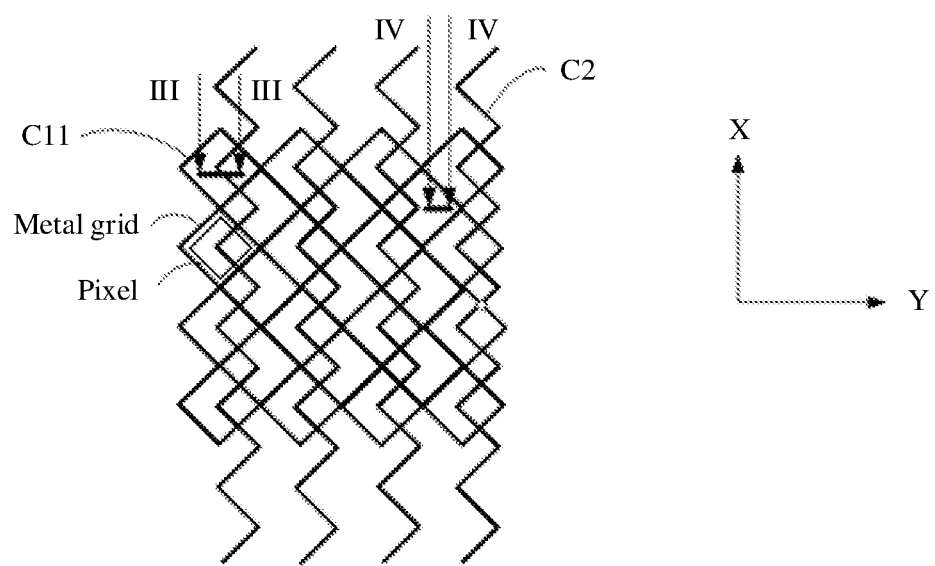
FIG. 20 is a schematic diagram of an enlarged structure of the any conductive pattern shown in FIG. 7 along an xx line according to a seventh embodiment of this application.
Figure 21:
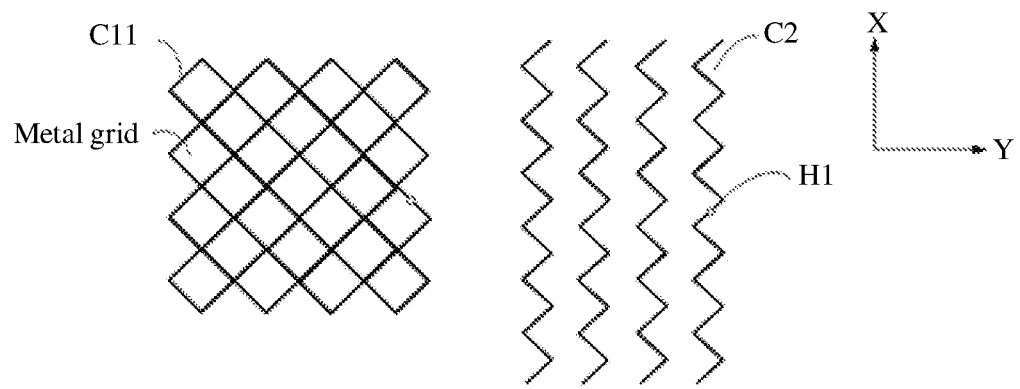
FIG. 21 is a schematic diagram of an exploded structure of a first metal sub-conducting wire and a second metal conducting wire in the conductive pattern shown in FIG. 20.

FIG. 20 is a schematic diagram of an enlarged structure of the any conductive pattern shown in FIG. 7 along an xx line according to a seventh embodiment of this application. FIG. 21 is a schematic diagram of an exploded structure of the first metal sub-conducting wire C11 and the second metal conducting wire C2 in the conductive pattern shown in FIG. 20.

As shown in FIG. 20 and FIG. 21, the first metal sub-conducting wire C11 is a metal conducting wire that extends in the first direction X and that forms a plurality of closed grids, and the second metal conducting wire C2 is a triangular-wave-shaped metal conducting wire extending in the second direction Y.

In this embodiment, the closed grid is a quadrilateral, and a diagonal line of the quadrilateral is parallel to the first direction X, or a diagonal line of the quadrilateral is perpendicular to the first direction X. In other words, a plurality of closed grids formed by the first metal sub-conducting wire C11 extending in the first direction X are diamonds continuously arranged in the first direction X.

In the extension direction of the second metal conducting wire C2, the second metal conducting wire C2 does not fully overlap a grid line that forms a metal grid. This effectively reduces an area of full overlapping between the second metal conducting wire used as the signal transmission line Li and a metal conducting wire in a conductive pattern, and effectively reduces drive load of the touch drive module TC.

In this embodiment, one metal grid corresponds to four pixel units (Pixels). In another embodiment of this application, a quantity of pixel units corresponding to one metal grid is not limited thereto. For example, one metal grid corresponds to eight pixel units (Pixels).

Figure 22:
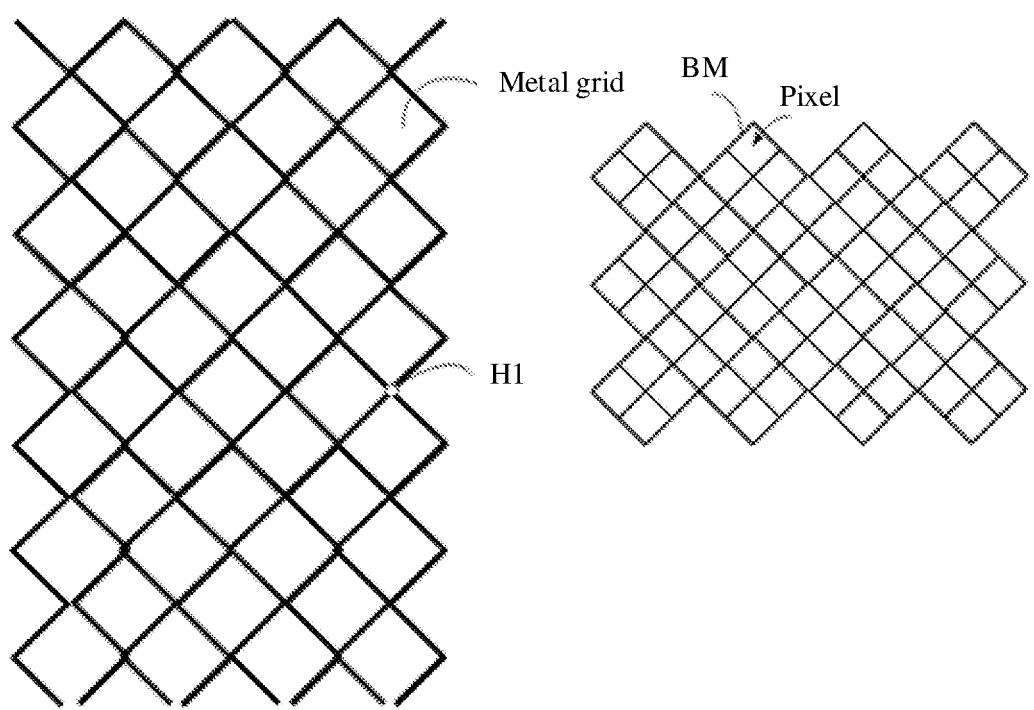
FIG. 22 is a schematic diagram of a plane structure obtained after a conductive grid and a corresponding pixel unit shown in FIG. 20 are exploded.
Figure 23:
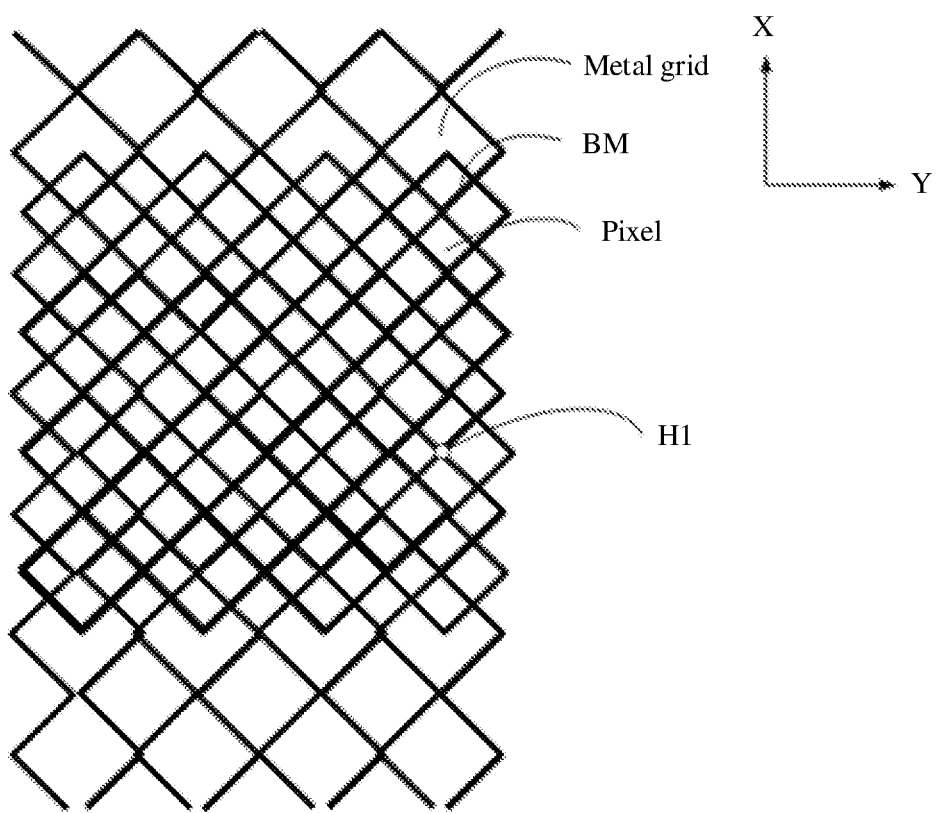
FIG. 23 is a schematic diagram of a plane structure obtained after the conductive grid and the pixel unit shown in FIG. 20 overlap.

Specifically, for a case in which one metal grid corresponds to four pixel units (Pixels), refer to FIG. 22 and FIG. 23. FIG. 22 is a schematic diagram of a plane structure obtained after the conductive grid and the corresponding pixel unit shown in FIG. 20 are exploded. FIG. 23 is a schematic diagram of a plane structure obtained after the conductive grid and the pixel unit shown in FIG. 20 overlap.

As shown in FIG. 22, each metal grid corresponds to four pixel units (Pixels), and only a metal conducting wire that forms a metal grid fully overlaps an edge area of a pixel unit (Pixel). In other words, the metal grid faces the black matrix BM. This effectively prevents display brightness of a pixel unit (Pixel) from being affected when a metal conducting wire fully overlaps an edge of a pixel unit (Pixel) corresponding to a pixel area.

Certainly, in another embodiment of this application, for a metal grid pattern shown in FIG. 22 or FIG. 23, the second metal conducting wire C2 may further face and fully overlap an edge of a metal grid on the first metal sub-conducting wire C11 in the second direction Y. This can further enable both the first metal sub-conducting wire C11 and the second metal conducting wire C2 to face a black matrix BM between pixel units (Pixels) and surround a pixel unit (Pixel), prevent a metal grid from blocking a light-emitting area of a pixel unit (Pixel), and further improve light transmittance and image display brightness of the image display panel 10.

Figure 24:
FIG. 24 is a schematic diagram of a cross-sectional structure of the conductive pattern at III-III shown in FIG. 20.

FIG. 24 is a schematic diagram of a cross-sectional structure of the conductive pattern at III-III shown in FIG. 20. As shown in FIG. 24, at a corresponding location at which the second metal conducting wire C2 is disposed in an area inside each metal grid, a floating metal conducting wire having a same material as the first metal sub-conducting wire C11 is disposed at the second metal layer 172. In this embodiment, a part of the floating metal conducting wire is not electrically connected to a ground terminal of the touch display panel. The floating metal conducting wire is disposed, so that the part of the metal conducting wire is not affected by electrical performance of the ground terminal. This further reduces signal interference between the first metal sub-conducting wires C11 and between the first metal sub-conducting wire C11 and the second metal conducting wire C2, so that the second metal conducting wire C2 used as the signal transmission line Li accurately transmits the first sensing signal sensed by the conductive pattern to the touch sensing module TC.

Figure 25:
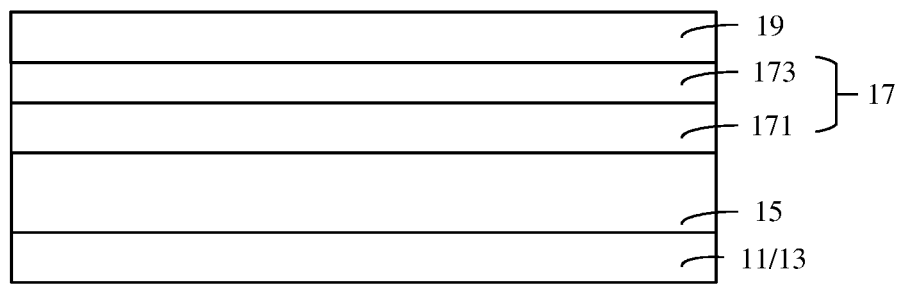
FIG. 25 is a schematic diagram of a cross-sectional structure of the conductive pattern at III-III shown in FIG. 20 according to another embodiment of this application.

FIG. 25 is a schematic diagram of a cross-sectional structure of the conductive pattern at III-III shown in FIG. 20 according to another embodiment of this application. As shown in FIG. 25, at a corresponding location at which the second metal conducting wire C2 is disposed in an area inside each metal grid, the first metal sub-conducting wire C11 is not disposed at the second metal layer 172. This reduces procedure complexity, and further improves light transmittance and image display brightness of the touch display panel.

Figure 26:
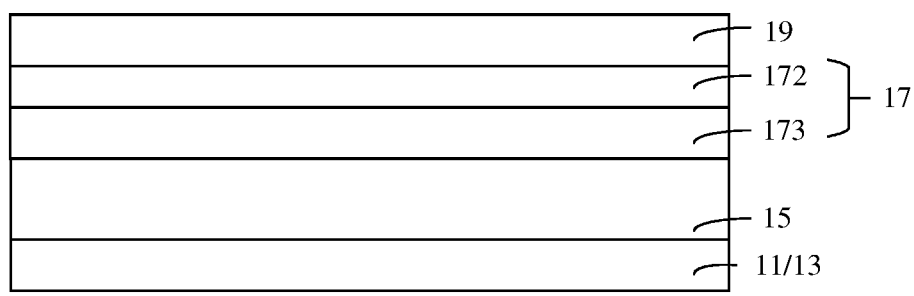
FIG. 26 is a schematic diagram of a cross-sectional structure of the conductive pattern at IV-IV shown in FIG. 20.

FIG. 26 is a schematic diagram of a cross-sectional structure of the conductive pattern at IV-IV shown in FIG. 20. As shown in FIG. 24, in a black matrix BM between corresponding adjacent pixel units (Pixels), at a location at which the first metal layer 171 and the second metal conducting wire C2 are not disposed on the second surface 152, a floating metal conducting wire having a same material as the first metal sub-conducting wire C11 is disposed at the second metal layer 172. This reduces signal interference C between the first metal sub-conducting wires C11 and between the first metal sub-conducting wire C11 and the second metal conducting wire C2.

Figure 27:
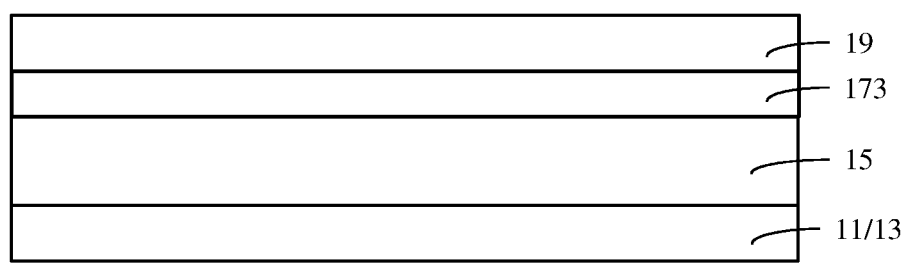
FIG. 27 is a schematic diagram of a cross-sectional structure of the conductive pattern at IV-IV shown in FIG. 20 according to another embodiment of this application.

FIG. 27 is a schematic diagram of a cross-sectional structure of the conductive pattern at IV-IV shown in FIG. 20 according to another embodiment of this application. As shown in FIG. 27, in a black matrix BM between corresponding adjacent pixel units (Pixels), at a location at which the first metal layer 171 and the second metal conducting wire C2 are not disposed on the second surface 152, the first metal sub-conducting wire C11 is not disposed at the second metal layer 172, and the second metal conducting wire C2 is not disposed at the first metal layer 171. This reduces procedure complexity.

Figure 28:
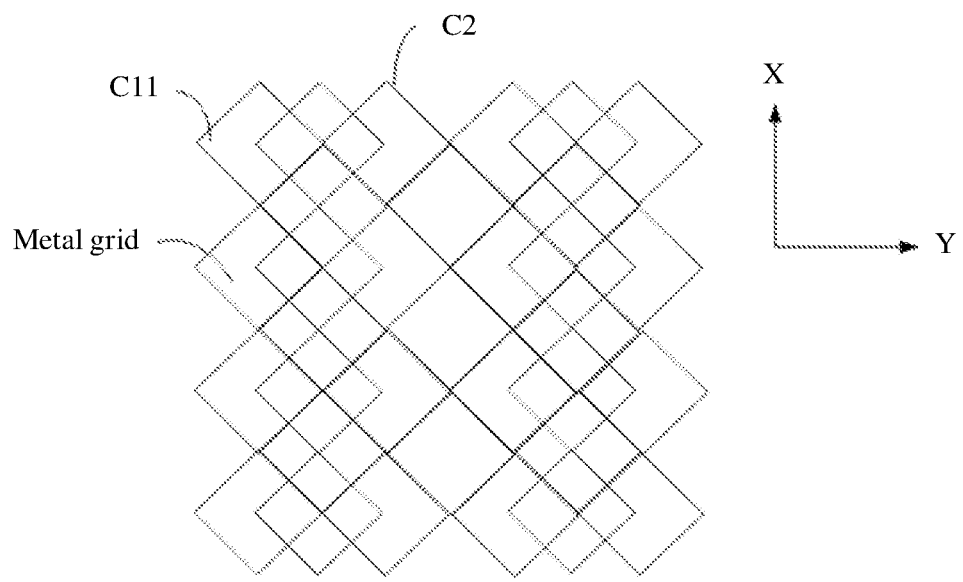
FIG. 28 is a schematic diagram of an enlarged structure of the any conductive pattern shown in FIG. 7 along an xx line according to an eighth embodiment of this application.
Figure 29:
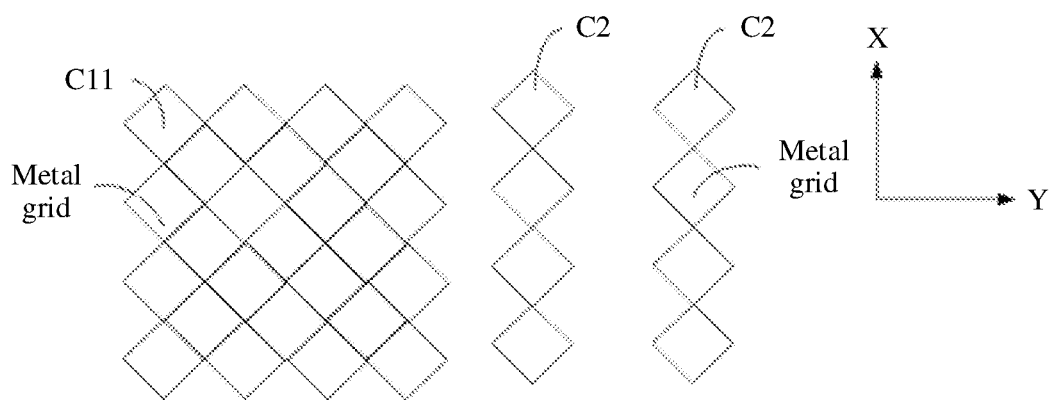
FIG. 29 is a schematic diagram of an exploded structure of a first metal sub-conducting wire and a second metal conducting wire in the conductive pattern shown in FIG. 28.

FIG. 28 is a schematic diagram of an enlarged structure of the any conductive pattern shown in FIG. 7 along an xx line according to an eighth embodiment of this application. FIG. 29 is a schematic diagram of an exploded structure of the first metal sub-conducting wire C11 and the second metal conducting wire C2 in the conductive pattern shown in FIG. 28.

As shown in FIG. 28 and FIG. 29, the first metal sub-conducting wire C11 is a metal conducting wire that extends in the first direction X and that forms a plurality of closed grids, and the second metal conducting wire C2 is a metal conducting wire that extends in the second direction Y and that forms a plurality of closed grids.

In this embodiment, the closed grid is a quadrilateral, and a diagonal line of the quadrilateral is parallel to the first direction X, or a diagonal line of the quadrilateral is perpendicular to the first direction X. In other words, a plurality of closed grids formed by the first metal sub-conducting wire C11 extending in the first direction X are diamonds continuously arranged in the first direction X.

In the extension direction of the second metal conducting wire C2, the second metal conducting wire C2 fully overlaps a grid line that forms a metal grid. This effectively reduces an area of full overlapping between the second metal conducting wire used as the signal transmission line Li and a metal conducting wire in a conductive pattern, and effectively reduces drive load of the touch drive module TC.

Figure 30:
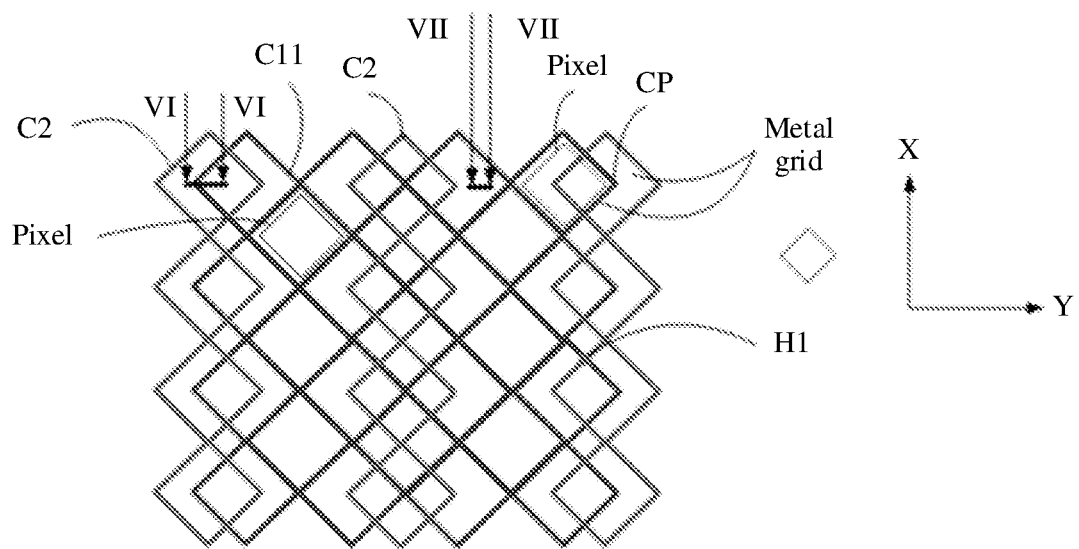
FIG. 30 is a schematic diagram of an enlarged structure of the any conductive pattern shown in FIG. 7 along an xx line according to a ninth embodiment of this application.
Figure 31:
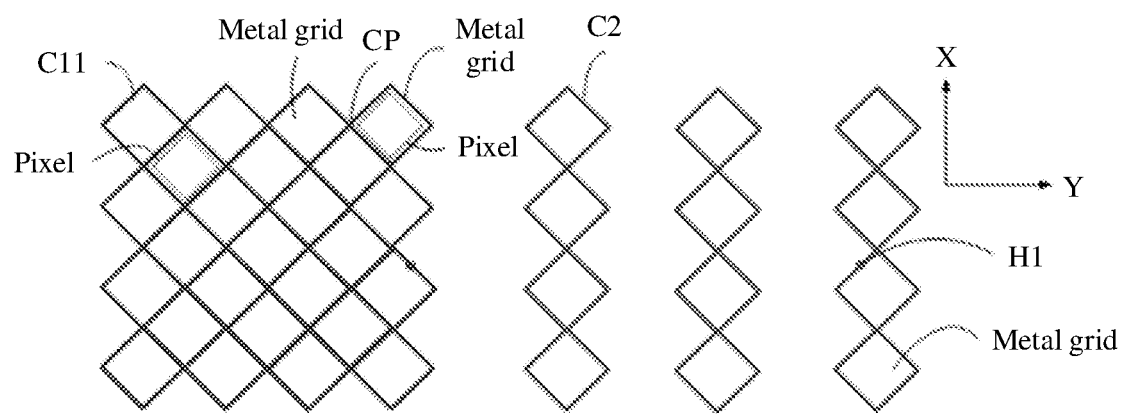
FIG. 31 is a schematic diagram of an exploded structure of a first metal sub-conducting wire and a second metal conducting wire in the conductive pattern shown in FIG. 30.

FIG. 30 is a schematic diagram of an enlarged structure of the any conductive pattern shown in FIG. 7 along an xx line according to a ninth embodiment of this application. FIG. 31 is a schematic diagram of an exploded structure of the first metal sub-conducting wire C11 and the second metal conducting wire C2 in the conductive pattern shown in FIG. 30.

As shown in FIG. 29 and FIG. 30, the first metal sub-conducting wire C11 is a metal conducting wire that extends in the first direction X and that forms a plurality of closed grids, and the second metal conducting wire C2 is a triangular-wave-shaped metal conducting wire extending in the second direction Y.

In this embodiment, the closed grid is a quadrilateral, and a diagonal line of the quadrilateral is parallel to the first direction X, or a diagonal line of the quadrilateral is perpendicular to the first direction X. In other words, a plurality of closed grids formed by the first metal sub-conducting wire C11 extending in the first direction X are diamonds continuously arranged in the first direction X.

In this embodiment, in the first metal grid C11, there is one metal connection point CP between any two adjacent metal grids in the first direction X.

The second conducting wire C2 is a metal conducting wire that extends in the second direction Y and that forms a plurality of closed metal grids. When the second conducting wire C2 and the first metal sub-conducting wire C11 fully overlap, the second conducting wire and the first metal sub-conducting wire do not fully overlap except for an intersection point generated due to different extension directions. Each metal grid on the second conducting wire C2 surrounds one metal conducting wire connection point CP, and there is at least one metal connection point CP between any two adjacent second conducting wires C2.

In the extension direction of the second metal conducting wire C2, the second metal conducting wire C2 does not fully overlap a grid line that forms a metal grid. This effectively reduces an area of full overlapping between the second metal conducting wire used as the signal transmission line Li and a metal conducting wire in a conductive pattern, and effectively reduces drive load of the touch drive module TC.

In this embodiment, a shape and a size of a metal grid on the first metal sub-conducting wire C11 are substantially the same as a shape and a size of one pixel unit (Pixel), and the metal grid faces the black matrix BM and surrounds the pixel unit (Pixel). This effectively prevents display brightness of a pixel unit (Pixel) from being affected when a metal conducting wire fully overlaps an edge of a pixel area.

In this embodiment, in the first metal sub-conducting wire C11 except for the location of intersection between the first metal sub-conducting wire C11 and the second metal conducting wire C2, a shape and a size of a metal grid on the first metal sub-conducting wire C11 are substantially the same as a shape and a size of one pixel unit (Pixel), and the metal grid faces the black matrix BM and surrounds the pixel unit (Pixel). In other words, because there is at least one metal connection point CP between any two adjacent second conducting wires C2, some metal grids on the first metal sub-conducting wire C11 do not intersect a metal grid on the second metal conducting wire C2 between any two adjacent second conducting wires C2. Therefore, a shape and a size of a metal grid that is in the first metal sub-conducting wire C11 and that does not intersect a metal grid on the second metal conducting wire C2 are substantially the same as a shape and a size of one pixel unit (Pixel), and the metal grid surrounds one pixel unit (Pixel). This effectively increases an effective area for performing touch sensing by the first metal sub-conducting wire C11, increases a quantity of output first sensing signals, and ensures touch operation identification accuracy.

Figure 32:
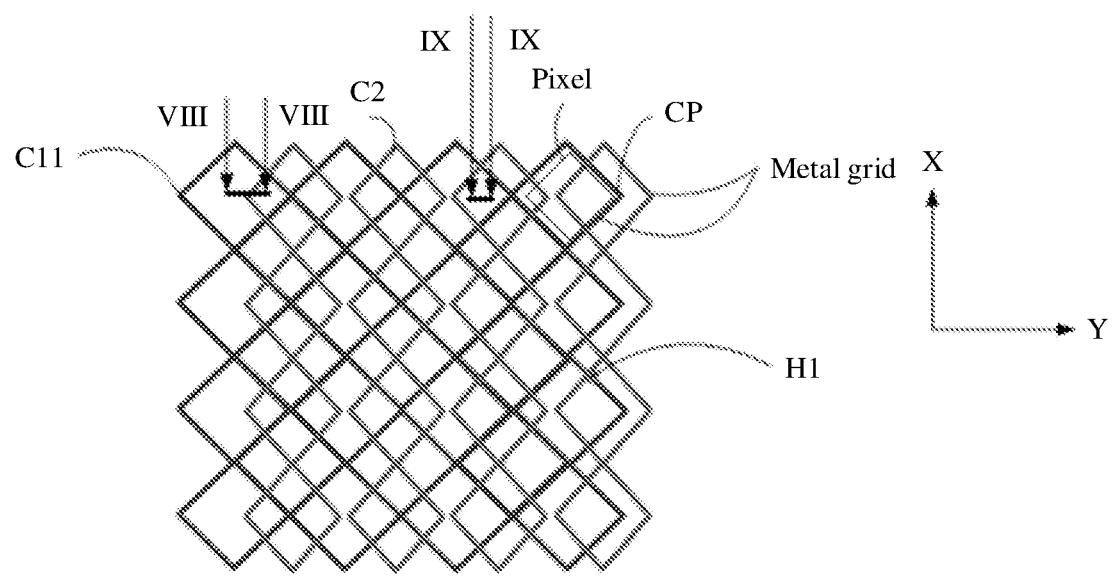
FIG. 32 is a schematic diagram of an enlarged structure of the any conductive pattern shown in FIG. 7 along an xx line according to a tenth embodiment of this application.
Figure 33:
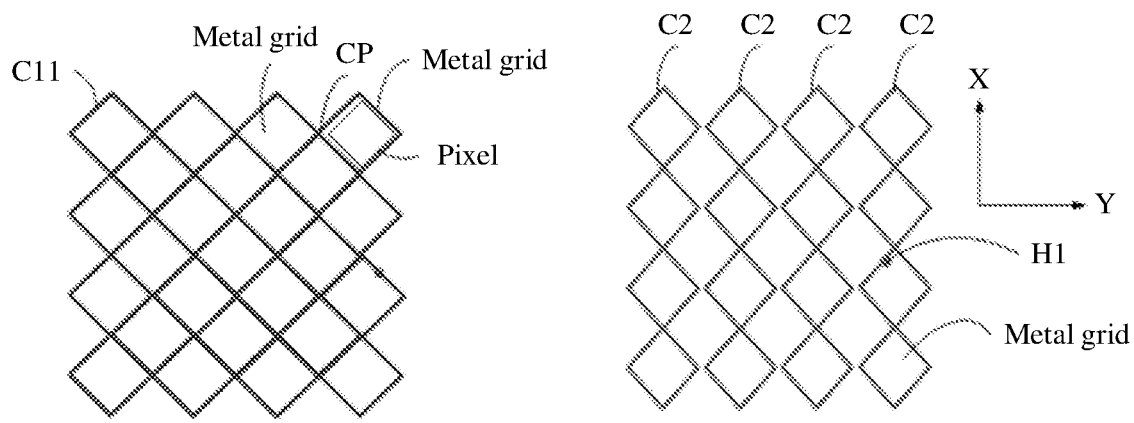
FIG. 33 is a schematic diagram of an exploded structure of a first metal sub-conducting wire and a second metal conducting wire in the conductive pattern shown in FIG. 32.

FIG. 32 is a schematic diagram of an enlarged structure of the any conductive pattern shown in FIG. 7 along an xx line according to a tenth embodiment of this application. FIG. 33 is a schematic diagram of an exploded structure of the first metal sub-conducting wire C11 and the second metal conducting wire C2 in the conductive pattern shown in FIG. 32.

As shown in FIG. 32 and FIG. 33, the first metal sub-conducting wire C11 is a metal conducting wire that extends in the first direction X and that forms a plurality of closed grids, and the second metal conducting wire C2 is a triangular-wave-shaped metal conducting wire extending in the second direction Y.

In this embodiment, the closed grid is a quadrilateral, and a diagonal line of the quadrilateral is parallel to the first direction X, or a diagonal line of the quadrilateral is perpendicular to the first direction X. In other words, a plurality of closed grids formed by the first metal sub-conducting wire C11 extending in the first direction X are diamonds continuously arranged in the first direction X.

In this embodiment, there is one metal connection point CP between any two adjacent metal grids in the first direction X.

The second conducting wire C2 is a metal conducting wire that extends in the second direction Y and that forms a plurality of closed metal grids. When the second conducting wire C2 and the first metal sub-conducting wire C11 fully overlap, the second conducting wire and the first metal sub-conducting wire do not fully overlap except for an intersection point generated due to different extension directions. Each metal grid on the second conducting wire C2 surrounds one metal conducting wire connection point CP, and metal connection points CP surrounded by any two adjacent second conducting wires C2 are adjacent in the first direction X.

In the extension direction of the second metal conducting wire C2, the second metal conducting wire C2 does not fully overlap a grid line that forms a metal grid. This effectively reduces an area of full overlapping between the second metal conducting wire used as the signal transmission line Li and a metal conducting wire in a conductive pattern, and effectively reduces drive load of the touch drive module TC.

In this embodiment, a shape and a size of a metal grid on the first metal sub-conducting wire C11 are substantially the same as a shape and size of one pixel unit (Pixel), one metal grid faces one pixel unit (Pixel), one metal grid faces one pixel unit (Pixel), and the metal grid faces the black matrix BM and surrounds the pixel unit (Pixel). This effectively prevents display brightness of a pixel unit (Pixel) from being affected when a metal conducting wire fully overlaps an edge of a pixel area.

At a corresponding location at which the second metal conducting wire C2 is disposed in an area inside each metal grid, a floating metal conducting wire having a same material as the first metal sub-conducting wire C11 is disposed at the second metal layer 172.

For example, for cross sections of the location along the VI-VI line shown in FIG. 30 and the location along the VIII-VIII line shown in FIG. 32, refer to FIG. 24. In this embodiment, a part of the floating metal conducting wire is not electrically connected to a ground terminal of the touch display panel. The floating metal conducting wire is disposed, so that the part of the metal conducting wire is not affected by electrical performance of the ground terminal. This further reduces signal interference between the first metal sub-conducting wires C11 and between the first metal sub-conducting wire C11 and the second metal conducting wire C2, so that the second metal conducting wire C2 used as the signal transmission line Li accurately transmits the first sensing signal sensed by the conductive pattern to the touch sensing module TC.

In another embodiment of this application, at a corresponding location at which the second metal conducting wire C2 is disposed in an area inside each metal grid, the first metal sub-conducting wire C11 is not disposed at the second metal layer 172. For example, for cross sections of the location along the VI-VI line shown in FIG. 30 and the location along the VIII-VIII line shown in FIG. 32, refer to FIG. 25. Because the first metal sub-conducting wire C11 is not disposed at the location, procedure complexity can be effectively reduced, and light transmittance and image display brightness of the touch display panel can be further improved.

At a corresponding location at which the second metal conducting wire C2 is not disposed in an area inside each metal grid, a floating metal conducting wire having a same material as the first metal sub-conducting wire C11 is disposed at the second metal layer 172. At a location at which the first metal layer 171 and the second metal conducting wire C2 are not disposed on the second surface 152, a floating metal conducting wire having a same material as the first metal sub-conducting wire C11 is disposed at the second metal layer 172. For example, for cross sections of the location along the VII-VII line shown in FIG. 30 and the location along the IX-IX line shown in FIG. 32, refer to FIG. 26.

The floating metal conducting wire is disposed, so that the part of the metal conducting wire is not affected by electrical performance of the ground terminal. This further reduces signal interference between the first metal sub-conducting wires C11 and between the first metal sub-conducting wire C11 and the second metal conducting wire C2, so that the second metal conducting wire C2 used as the signal transmission line Li accurately transmits the first sensing signal sensed by the conductive pattern to the touch sensing module TC.

At a corresponding location at which the second metal conducting wire C2 is disposed in an area inside each metal grid, the first metal sub-conducting wire C11 is not disposed at the second metal layer 172. For example, for cross sections of the location along the VII-VII line shown in FIG. 30 and the location along the IX-IX line shown in FIG. 32, refer to FIG. 27. Because the first metal sub-conducting wire C11 and the second metal conducting wire C2 are not disposed, procedure complexity can be effectively reduced, and light transmittance and image display brightness of the touch display panel can be further improved.

The foregoing descriptions are embodiments of this application. It should be noted that a person of ordinary skill in the art may still make several improvements or polishing without departing from the principle of this application, and the improvements or polishing shall also fall within the protection scope of this application.

The invention claimed is:
1. A touch display panel, comprising:
an array substrate;
a display medium layer;
a package substrate that is sequentially stacked with the array substrate and the display medium layer, wherein the display medium layer emits light to display an image through cooperation between the array substrate and the package substrate, wherein the package substrate comprises a first surface and a second surface that are disposed opposite each other, wherein the first surface is adjacent to the display medium layer, and wherein the second surface is spaced apart from the display medium layer;

a first metal layer and a second metal layer that are mutually insulated are sequentially disposed on the second surface, wherein the second metal layer comprises a plurality of conductive patterns that are arranged in a matrix form in a first direction and a second direction, wherein the plurality of conductive patterns each output a first sensing signal through self-capacitance when sensing a touch operation, wherein the first direction is perpendicular to the second direction, wherein each conductive pattern comprises a first area and a second area that do not overlap, wherein the first area comprises a plurality of first metal sub-conducting wires extending in the first direction, wherein the second area comprises at least one second metal sub-conducting wire extending in a direction different from the first direction, and wherein the at least one second metal sub-conducting wire is electrically connected to the plurality of first metal sub-conducting wires in the first area; and a plurality of second metal conducting wires extending in the second direction and that are disposed in the first area corresponding to the first metal layer, wherein each metal conducting wire of the plurality of second metal conducting wires does not overlap the first metal sub-conducting wire in the second direction, wherein at least one second metal conducting wire of the plurality of second metal conducting wires is electrically connected to one conductive pattern and is configured to transmit the first sensing signal to a touch controller, and wherein the touch controller is configured to identify a location of the touch operation based on the first sensing signal.

2. The touch display panel according to claim 1, wherein the array substrate comprises a plurality of pixel areas that are arranged in a matrix form, wherein the display medium layer corresponds to each pixel area to form one pixel unit, wherein a black matrix is between adjacent pixel units, and wherein the pixel unit is configured to emit light to display an image; and wherein, in the first area, the plurality of first metal sub-conducting wires intersect the plurality of second metal conducting wires to form a plurality of closed metal grids, wherein each metal grid of the plurality of closed metal grids faces the pixel unit and fully overlaps the black matrix, and wherein a shape of the respective metal grid is the same as a shape of the pixel unit.

3. The touch display panel according to claim 2, wherein a first metal sub-conducting wire of the plurality of first metal sub-conducting wires is a square-wave-shaped metal conducting wire extending in the first direction, wherein a second metal conducting wire of the plurality of second metal conducting wires is a rectilinear metal conducting wire extending in the second direction, and wherein two adjacent first metal sub-conducting wires of the plurality of first metal sub-conducting wires intersect two adjacent second metal conducting wires of the plurality of second metal conducting wires to form one metal grid.

4. The touch display panel according to claim 2, wherein the plurality of first metal sub-conducting wires is a plurality of continuous trapezoidal metal conducting wires extending in the first direction, wherein a second conducting wire of the plurality of second metal conducting wires is a rectilinear metal conducting wire extending in the second direction, and two adjacent first metal sub-conducting wires intersect two adjacent second metal conducting wires to form one metal grid.

5. The touch display panel according to claim 2, wherein a first metal sub-conducting wire of the plurality of first metal sub-conducting wires is a triangular-wave-shaped metal conducting wire extending in the first direction, wherein the plurality of second metal conducting wires is a plurality of continuous trapezoidal metal conducting wires extending in the second direction, and wherein two adjacent first metal sub-conducting wires of the plurality of first metal sub-conducting wires intersect two adjacent second metal conducting wires of the plurality of second metal conducting wires to form one metal grid.

6. The touch display panel according to claim 2, wherein the plurality of first metal sub-conducting wires and the plurality of second metal conducting wires are each triangular-wave-shaped metal conducting wires extending in a same direction, wherein wires of the plurality of first metal sub-conducting wires and wires of the plurality of second metal conducting wires that are adjacent to each other intersect to form metal grids that are continuously arranged in an extension direction, and wherein one metal grid faces one pixel unit.

7. The touch display panel according to claim 6, wherein at least one of:

a first metal sub-conducting wire of the plurality of first metal sub-conducting wires is a triangular-wave-shaped metal conducting wire extending in the first direction, and a second conducting wire of the plurality of second metal conducting wires is a triangular-wave-shaped metal conducting wire extending in the second direction; or a first metal sub-conducting wire of the plurality of first metal sub-conducting wires is a triangular-wave-shaped metal conducting wire extending in the second direction, and a second conducting wire of the plurality of second metal conducting wires is a triangular-wave-shaped metal conducting wire extending in the second direction;

wherein two adjacent first metal sub-conducting wires of the plurality of first metal sub-conducting wires intersect two adjacent second metal conducting wires of the plurality of second metal conducting wires to form a plurality of metal grids, and wherein one metal grid of the plurality of metal grids faces one pixel unit; and wherein two adjacent first metal sub-conducting wires of the plurality of first metal sub-conducting wires intersect two adjacent second metal conducting wires of the plurality of second metal conducting wires to form four metal grids, and the four metal grids are arranged in a rectangle form.

8. The touch display panel according to claim 2, wherein one metal grid of the plurality of closed metal grids faces one pixel unit; and wherein at least one of:

a floating metal conducting wire having a same material as the plurality of first metal sub-conducting wires is disposed at the second metal layer at a location corresponding to a second metal conducting wire of the plurality of the second metal conducting wires at the second metal layer other than the first metal sub-conducting wire; or a metal conducting wire having a same material as the first metal sub-conducting wire is not disposed at the second metal layer at a location corresponding to a second metal conducting wire of the plurality of the second metal conducting wires at the second metal layer other than the first metal sub-conducting wire.

9. The touch display panel according to claim 2, wherein a first metal sub-conducting wire of the plurality of first metal sub-conducting wires is a metal conducting wire that extends in the first direction and that forms the plurality of closed metal grids, wherein a second conducting wire of the plurality of second metal conducting wires is a triangular-wave-shaped metal conducting wire extending in the second direction, wherein the second conducting wire does not overlap a metal grid of the plurality of closed metal grids in the second direction, and wherein one metal grid of the plurality of closed metal grids faces four pixel units.

10. The touch display panel according to claim 9, wherein, at a location that is in the metal grid and that corresponds to the second metal conducting wire, at least one of:
a floating metal conducting wire having a same material as the first metal sub-conducting wire is disposed at the second metal layer; or
the first metal sub-conducting wire is not disposed at the second metal layer; and
wherein, in a black matrix between adjacent pixel units, at a location at which the first metal sub-conducting wire and the second metal conducting wire are not disposed on the second surface, at least one of:
a floating metal conducting wire having a same material as the first metal sub-conducting wire is disposed at the second metal layer; or
the first metal sub-conducting wire is not disposed at the second metal layer.

11. The touch display panel according to claim 2, wherein a first metal sub-conducting wire of the plurality of first metal sub-conducting wires is a metal conducting wire that extends in the first direction and that forms a first plurality of closed metal grids, wherein a second conducting wire of the plurality of the second metal conducting wires is a metal conducting wire that extends in the second direction and that forms a second plurality of closed metal grids, wherein the second plurality of closed metal grids comprised in the second conducting wire do not overlap the first plurality of closed metal grids, and wherein one metal grid of at least one of the plurality of first closed metal grids or the plurality of second closed metal grids faces four pixel units.

12. The touch display panel according to claim 2, wherein a first metal sub-conducting wire of the plurality of first metal sub-conducting wires is a metal conducting wire that extends in the first direction and that forms a first plurality of closed metal grids, and wherein there is one metal connection point is between any two adjacent metal grids of the first plurality of closed metal grids in the first direction; and
wherein a second conducting wire of the plurality of second metal conducting wires is a metal conducting wire that extends in the second direction and that forms a second plurality of closed metal grids, wherein a metal grid on the second conducting wire surrounds one metal conducting wire connection point, and wherein at least one metal connection point is between any two adjacent second conducting wires of the plurality of the second metal conducting wires.

13. The touch display panel according to claim 12, wherein, in the first area, a metal grid on a first metal sub-conducting wire surrounds one pixel unit at a location that is in the first metal sub-conducting wire and that does not intersect the second conducting wire.

14. The touch display panel according to claim 2, wherein the first metal sub-conducting wire of the plurality of first metal sub-conducting wires is a metal conducting wire that extends in the first direction and that forms a first plurality of closed metal grids, and wherein one metal connection point is between any two adjacent metal grids of the first plurality of closed metal grids in the first direction; and
wherein a second conducting wire of the plurality of second metal conducting wires is a metal conducting wire that extends in the second direction and that forms a second plurality of closed metal grids, wherein a metal grid on the second conducting wire surrounds one metal conducting wire connection point, and wherein any two adjacent second conducting wires of the plurality of the second metal conducting wires surround two adjacent metal connection points.

15. The touch display panel according to claim 1, wherein, at locations at which the plurality of first metal sub-conducting wires intersect the plurality of second metal conducting wires, a dielectric material is disposed between the second metal layer and the first metal layer.

16. The touch display panel according to claim 1, wherein at least one of:
a metal conducting wire material of the plurality of first metal sub-conducting wire is not disposed at the second metal layer at locations at which the plurality of first metal sub-conducting wires intersect the plurality of second metal conducting wires; or
a floating first metal sub-conducting wire is disposed at the second metal layer at locations at which the plurality of first metal sub-conducting wires intersect the plurality of second metal conducting wires.

17. The touch display panel according to claim 1, wherein the second area comprises a plurality of second metal sub-conducting wires, and wherein the plurality of second metal sub-conducting wires form a plurality of metal grids.

18. The touch display panel according to claim 17, wherein a first dielectric layer is disposed between the first metal layer and the second metal layer; and
wherein, in the first area, the first dielectric layer comprises a first via, and a second metal conducting wire of the plurality of second metal conducting wires is electrically connected to the conductive pattern through the first via.

19. The touch display panel according to claim 18, wherein there is a black matrix is between adjacent pixel units, and wherein a first metal sub-conducting wire of the plurality of first metal sub-conducting wires, a second metal sub-conducting wire of the plurality of second metal sub-conducting wires, and the second metal conducting wire all face the black matrix.

20. A touch display apparatus, comprising the touch display panel according to claim 1, and a touch controller, wherein the touch controller is configured to identify, based on a received sensing signal, a location of a touch operation received by the touch display panel.

* * * * *